United States Patent
Chen et al.

(10) Patent No.: US 11,942,467 B2
(45) Date of Patent: Mar. 26, 2024

(54) SEMICONDUCTOR STRUCTURE, ELECTRONIC DEVICE, AND METHOD OF MANUFACTURING SEMICONDUCTOR STRUCTURE

(71) Applicant: TAIWAN SEMICONDUCTOR MANUFACTURING COMPANY LTD., Hsinchu (TW)

(72) Inventors: I-Sheng Chen, Taipei (TW); Yi-Jing Li, Hsinchu (TW); Chia-Ming Hsu, Hualien County (TW); Wan-Lin Tsai, Hsinchu (TW); Clement Hsingjen Wann, Carmel, NY (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 350 days.

(21) Appl. No.: 17/351,240

(22) Filed: Jun. 18, 2021

(65) Prior Publication Data
US 2022/0406768 A1 Dec. 22, 2022

(51) Int. Cl.
*H01L 23/64* (2006.01)
*H01L 21/70* (2006.01)
*H01L 27/01* (2006.01)
*H01L 49/02* (2006.01)

(52) U.S. Cl.
CPC .......... *H01L 27/016* (2013.01); *H01L 21/707* (2013.01); *H01L 28/60* (2013.01)

(58) Field of Classification Search
None
See application file for complete search history.

(56) References Cited

U.S. PATENT DOCUMENTS

| | | | |
|---|---|---|---|
| 2006/0180895 A1* | 8/2006 | Chen | H01L 29/93 257/595 |
| 2011/0215390 A1* | 9/2011 | Kim | H01L 29/861 257/532 |
| 2014/0231957 A1* | 8/2014 | Zhu | H01L 28/40 257/532 |
| 2015/0022948 A1* | 1/2015 | An | H01G 4/30 361/303 |
| 2017/0301675 A1* | 10/2017 | Harjani | H01L 27/0805 |
| 2020/0286823 A1* | 9/2020 | Wang | H01L 28/60 |

* cited by examiner

*Primary Examiner* — Benjamin P Sandvik
(74) *Attorney, Agent, or Firm* — WPAT LAW; Anthony King

(57) ABSTRACT

A semiconductor structure includes a first metal-dielectric-metal layer, a first dielectric layer, a first conductive layer, a second conductive layer, and a second dielectric layer. The first metal-dielectric-metal layer includes a plurality of first fingers, a plurality of second fingers, and a first dielectric material. The first fingers are electrically connected to a first voltage. The second fingers are electrically connected to a second voltage different from the first voltage, and the first fingers and the second fingers are arranged in parallel and staggeredly. The first dielectric material is between the first fingers and the second fingers. The first dielectric layer is over the first metal-dielectric-metal layer. The first conductive layer is over the first dielectric layer. The second conductive layer is over the first conductive layer. The second dielectric layer is between the first conductive layer and the second conductive layer.

20 Claims, 32 Drawing Sheets

SEMICONDUCTOR STRUCTURE, ELECTRONIC DEVICE, AND METHOD OF MANUFACTURING SEMICONDUCTOR STRUCTURE

BACKGROUND

Integrated chips are formed on semiconductor dies that include millions or billions of transistor devices. The transistor devices are configured to act as switches and/or to produce power gains so as to enable logical functionality for an integrated chip (e.g., functionality to perform logic functions). Integrated chips often also include passive devices, such as capacitors, resistors, inductors, varactors, etc. Passive devices are widely used to control integrated chip characteristics (e.g., gain, time constants, etc.) and to provide an integrated chip with a wide range of different functionalities (e.g., incorporating both analog and digital circuitry on the same die).

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
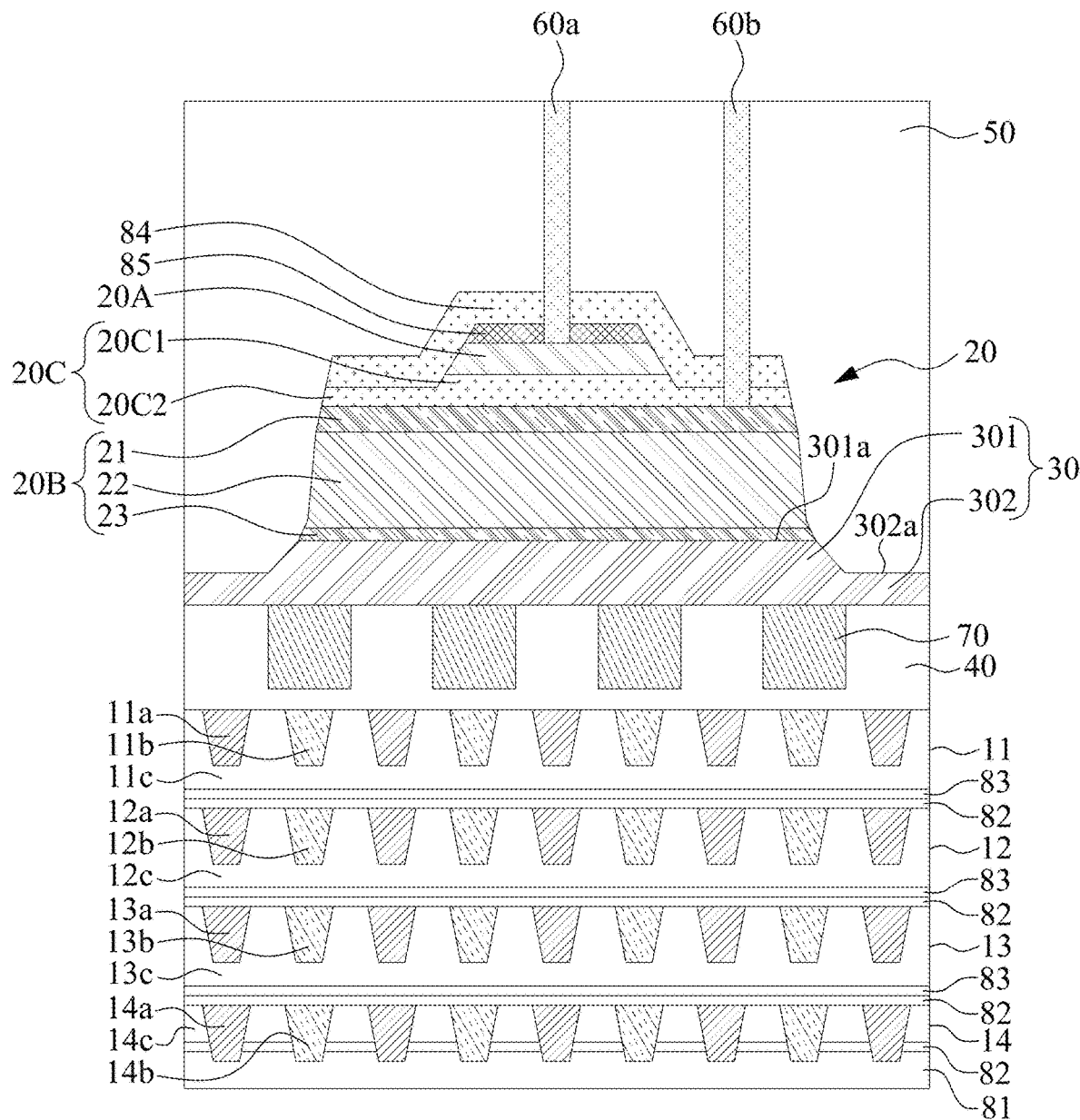
FIG. 1 is a cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The term "standard cell" or "cell" used throughout the present disclosure refers to a group of circuit patterns in a design layout to implement specific functionalities of a circuit. A standard cell is comprised of one or more layers, and each layer includes various patterns expressed as unions of polygons. A design layout may be initially constructed by a combination of identical or different standard cells. The cells are interconnected using a routing structure. The geometries of the patterns in the cells may be adjusted at different stages of layout design in order to compensate for design and process effects. A standard cell may cover circuits corresponding to a portion or an entirety of a die to be manufactured. The standard cells may be accessible from cell libraries provided by semiconductor manufacturers or designers. In some embodiments, the standard cells are included in a standard cell library, which may be stored in a non-transitory computer-readable storage medium and accessed by a processor in various circuit design stages.

Embodiments of the present disclosure discuss semiconductor structures including both one or more MIM capacitors and one or more MOM capacitors and manufacturing methods of the semiconductor structures for the combined capacitor structure to serve as a decoupling capacitor for stabilizing the power signal and reducing noise. With the arrangement of a dielectric layer interposed between the MOM capacitor(s) and the MIM capacitor, the overall capacitance density can be increased due to the parasitic capacitance generated, which is advantageous to increasing the operation voltage. In addition, the combination of the MIM capacitor and the MOM capacitor can provide an increased capacitance value without significantly increasing the complexity as well as costs of the manufacturing process of the semiconductor structure.

FIG. 1 is a cross-sectional view of a semiconductor structure 1 in accordance with some embodiments of the present disclosure. In some embodiments, the semiconductor structure 1 can be included in an electronic device which is not limited by the present disclosure.

Referring to FIG. 1, in some embodiments, the semiconductor structure 1 includes one or more MOM capacitors (e.g., MOM capacitors 11-14), one or more MIM capacitors (e.g., a MIM capacitor 20), dielectric layers 30 and 40, an inter-level dielectric (ILD) 50, conductive interconnections 60a and 60b, and a metal layer 70.

The MOM capacitors 11-14 may be disposed over a substrate (not shown in FIG. 1). In some embodiments, the substrate (also referred to as a die substrate) may include a bulk silicon substrate or a silicon-on-insulator (SOI) substrate. In other embodiments, the substrate may include semiconductor materials that include group group IV, and/or group V elements. For example, the substrate may include germanium (Ge), silicon germanium (SiGe), silicon carbide (SiC), gallium arsenide (GaAs), or the like. The substrate may be a p-type semiconductor substrate (acceptor type) or an n-type semiconductor substrate (donor type). In some embodiments a periphery region and a cell region can be defined over the substrate. Various electrical components may be formed over the substrate. In some embodiments, active devices, i.e., transistors can be formed over the substrate in the periphery region, while the capacitors (e.g., the MOM capacitors 11-14 and the MIM capacitor 20) can be formed over the substrate in the cell region, as illustrated in FIG. 1.

Referring to FIG. 1, the MOM capacitors 11-14 are stacked over the substrate. For example, the MOM capacitor 11 (also referred to as "the metal-dielectric-metal layer") is stacked with the MOM capacitor 12 (also referred to as "the metal-dielectric-metal layer"). In some embodiments, the MOM capacitor 14 (also referred to as "the metal-dielectric-metal layer") may be the bottommost MOM capacitor within the stack of the MOM capacitors 11-14, and the MOM capacitor 11 may be the topmost MOM capacitor within the stack of the MOM capacitors 11-14. In some embodiments, the MOM capacitor 11 is interposed between the dielectric layer 30 and the MOM capacitor 12.

Referring to FIG. 1, the MOM capacitor 11 may include a plurality of fingers 11a (also referred to as "conductive fingers"), a plurality of fingers 11b (also referred to as "conductive fingers"), and a dielectric material 11c. The fingers 11a and the fingers 11b may be arranged in parallel and staggeredly. The dielectric material 11c may be between the fingers 11a and the fingers 11b. The fingers 11a and the fingers 11b may respectively electrically connect to two electrodes of the MOM capacitor 11. In some embodiments, the MOM capacitor 12 includes a plurality of fingers 12a, a plurality of fingers 12b, and a dielectric material 12c. The fingers 12a and the fingers 12b may be arranged in parallel and staggeredly. The dielectric material 12c may be between the fingers 12a and the fingers 12b. The fingers 11a, 11b, 12a and 12b may be in parallel.

In some embodiments, the MOM capacitor 13 (also referred to as "the metal-dielectric-metal layer") includes a plurality of fingers 13a, a plurality of fingers 13b, and a dielectric material 13c. The fingers 13a and the fingers 13b may be arranged in parallel and staggeredly. The dielectric material 13c may be between the fingers 13a and the fingers 13b. The fingers 11a, 11b, 12a, 12b, 13a, and 13b may be in parallel. In some embodiments, the MOM capacitor 14 includes a plurality of fingers 14a, a plurality of fingers 14b, and a dielectric material 14c. The fingers 14a and the fingers 14b may be arranged in parallel and staggeredly. The dielectric material 14c may be between the fingers 14a and the fingers 14b. The fingers 11a, 11b, 12a, 12b, 13a, 13b, 14a, and 14b may be in parallel.

The fingers 11a, 11b, 12a, 12b, 13a, 13b, 14a, and 14b of the MOM capacitors 11-14 may include various conductive materials, such as copper (Cu), tungsten (W), cobalt (Co), aluminum (Al), tantalum (Ta), tantalum nitride (TaN), titanium nitride (TiN), an alloy thereof, a combination therefore, or the like, but the present disclosure is not limited thereto. In some embodiments, at least one of the fingers may include a barrier layer (not shown in FIG. 1) adhering and spacing between the conductive material of the finger and the sidewall defined by the dielectric material. In some embodiments, the barrier layer may include Ta, TaN, TiN, a combination thereof, or the like. In some embodiments, the conductive material of the fingers may include Cu, W, Co, Al, an alloy thereof, a combination thereof, or the like. The dielectric materials 11c, 12c, 13c, and 14c may include various insulating materials or dielectric materials, such as silicon oxide, silicon oxynitride, silicon oxycarbide, a combination thereof, or the like, but the present disclosure is not limited thereto. In some embodiments, the dielectric materials 11c, 12c, 13c, and 14c may include one or more low-k dielectric materials having k values lower than or equal to about 3.9. In some embodiments, the k value of the low-k dielectric material may be lower than or equal to about 3. In some embodiments, the k value of the low-k dielectric material may range from about 2.5 to about 3.

In some embodiments, the cross-section of each of the fingers 11a, 11b, 12a, 12b, 13a, 13b, 14a, and 14b may have a rectangular shape or a trapezoid shape tapering from a top surface toward a bottom surface. In some embodiments, a cross-sectional width of the top surface of each of the fingers ranges from about 50 nm to about 200 nm. In some embodiments, a cross-sectional width of the bottom surface of each of the fingers ranges from about 30 nm to about 200 nm. In some embodiments, a distance between the top surfaces of adjacent fingers ranges from about 70 nm to about 350 nm. In some embodiments, a distance between the bottom surfaces of adjacent fingers ranges from about 70 nm to about 400 nm.

Referring to FIG. 1, the semiconductor structure 1 may further include an ILD layer 81, etch stop layers 82, and liners 83. In some embodiments, the MOM capacitors 11-14 are over the ILD layer 81, and the etch stop layers 82 are over the ILD layer 81 and each of the dielectric materials 12c-14c. Each of the liner layers 83 may be conformally disposed over each of the etch stop layers 82. The ILD layer 81 may include, but are not limited to, $SiN_x$, $SiO_x$, SiON, SiC, SiBN, SiCBN, or any combinations thereof. The etch stop layer 82 may include SiC, $SiN_x$, or the like. The liner 83 may include tetraethyl orthosilicate (TEOS) or the like.

The MIM capacitor 20 may be over the MOM capacitor 11. In some embodiments, the MIM capacitor 20 may include conductive layers 20A, 20B, and a dielectric layer 20C. The conductive layers 20A and 20B may serve as or electrically connect to electrodes of the MIM capacitor 20. In some embodiments, the conductive layer 20B is over the dielectric layer 30, the conductive layer 20A is over the conductive layer 20B, and the dielectric layer 20C is between the conductive layer 20A and the conductive layer 20B.

In some embodiments, the conductive layer 20B includes sub-layers 21, 22 and 23. In some embodiments, the sub-layer 23 is proximal to the dielectric layer 30, the sub-layer 21 is distal from the dielectric layer 30, and the sub-layer 22 is between the sub-layer 21 and the sub-layer 23. In some embodiments, a material of the sub-layer 22 may be different from materials of the sub-layers 21 and 23. The sub-layer 23 may taper toward the sub-layer 22. The sub-layer 22 may taper toward the sub-layer 21. The sub-layer 21 may taper toward the dielectric layer 20C.

The dielectric layer 20C may include a stepped structure. In some embodiments, the dielectric layer 20C includes a portion 20C1 proximal to the conductive layer 20A and a portion 20C2 proximal to the conductive layer 20B, and a width of the portion 20C1 is less than a width of the portion 20C2. In some embodiments, a lateral surface of the portion 20C1, a portion of a top surface of the portion 20C2, and a lateral surface of the portion 20C2 form a stepped profile of the dielectric layer 20C. The portion 20C2 may taper toward the portion 20C1, and the portion 20C1 may taper toward the conductive layer 20A. A lateral surface of the conductive layer 20B and a lateral surface of the portion 20C2 of the dielectric layer 20C form a continuous surface. In some embodiments, a thickness of the conductive layer 20B is about 2000 Å.

In some embodiments, the conductive layer 20A is over the dielectric layer 20C. In some embodiments, the conductive layer 20A is over the portion 20C1 of the dielectric layer 20C. The conductive layer 20A may be spaced apart from the portion 20C2 of the dielectric layer 20C by the portion 20C1 of the dielectric layer 20C. The conductive layer 20A may taper away from the dielectric layer 20C. In some embodiments, a thickness of the conductive layer 20A is about 800 Å. In some embodiments, a thickness of the dielectric layer 20C ranges from about 300 Å to about 700 Å.

The conductive layer 20A and the sub-layers 21-23 of the conductive layer 20B may include various conductive materials, such as Cu, W, Co, Al, Ta, TaN, Ti, TiN, an alloy thereof, a combination therefore, or the like, but the present disclosure is not limited thereto. In some embodiments, the conductive layers 20A and the sub-layer 22 include AlCu, and the sub-layers 21 and 23 include TaN. The dielectric layer 20C may include a high-k dielectric material. In some embodiments, the dielectric layer 20C may include aluminum oxide ($Al_2O_3$), zirconium oxide ($ZrO_2$), silicon nitride ($Si_3N_4$), tantalum nitride ($Ta_2O_5$), titanium oxide ($TiO_2$), strontium titanate ($SrTiO_3$), yttrium oxide ($Y_2O_3$), lanthanum oxide ($La_2O_3$), hafnium oxide ($HfO_2$), a multi-layer structure of the combination thereof, or the like.

In some embodiments, the semiconductor structure 1 may further include a cap layer 84 and a mask layer 85. The mask layer 85 is between the MIM capacitor 20 and the cap layer 84. The mask layer 85 may be formed directly on the conductive layer 20A of the MIM capacitor 20. Lateral surfaces of the mask layer 85 may substantially align to lateral surfaces of the conductive layer 20A of the MIM capacitor 20. The mask layer 85 may taper toward the cap layer 84. The mask layer 85 may include nitride or oxynitride, such as silicon nitride ($SiN_x$), silicon oxynitride (SiON), or the like. In some embodiments, a thickness of the mask layer 85 ranges from about 200 Å to about 400 Å.

The cap layer 84 may be formed over the conductive layer 20A of the MIM capacitor 20. In some embodiments, the cap layer 84 may contact the dielectric layer 20C. In some embodiments, the cap layer 84 may contact the lateral surfaces of the conductive layer 20A. In some embodiments, the cap layer 84 has a greater mechanical strength than that of the stack of the capacitors, so as to alleviate the affection of external force applied on the stack of the capacitors. The cap layer 84 may include nitride, oxide, or a combination thereof, such as plasma enhanced deposited silicon nitride, silicon oxide, or the like.

Referring to FIG. 1, the dielectric layer 30 is between the MIM capacitor 20 and the MOM capacitor 11. In some embodiments, the dielectric layer 30 is over the MOM capacitor 11 (or the metal-dielectric-metal layer). The dielectric layer 30 may include a stepped structure. In some embodiments, the dielectric layer 30 includes a portion 301 proximal to the conductive layer 20B and a portion 302 proximal to the MOM capacitor 11, and a width of the portion 301 is less than a width of the portion 302. The portion 301 may taper toward the conductive layer 20B. A distance between a top surface 302a of the portion 302 and a top surface 301a of the portion 301 is about 360 Å. In some embodiments, a thickness of the dielectric layer 30 ranges from about 900 Å to about 4000 Å. In some embodiments, a thickness of the dielectric layer 30 ranges from about 900 Å to about 1900 Å. In some embodiments, the dielectric layer 30 includes silicon carbide (SiC), silicon nitride ($SiN_x$), or a combination thereof.

The dielectric layer 40 (also referred to as "the passivation layer") may be between the dielectric layer 30 and the MOM capacitor 11. The dielectric layer 40 may include un-doped silicate glass (USG), oxide, such as plasma enhanced deposited silicon oxide, or the like. The metal layer 70 (also referred to as "the patterned metal layer") may be between the dielectric layer 30 and the MOM capacitor 11 (or the metal-dielectric-metal layer). In some embodiments, the metal layer 70 is within the dielectric layer 40. In some embodiments, the metal layer 70 may include a plurality of metal lines in parallel to the fingers 11a and 11b of the MOM capacitor 11. In some embodiments, the metal layer 70 may include dummy metal patterns or layers. In some other embodiments, the metal layer 70 may be electrically connected to the MOM capacitors 11-14 and/or the MIM capacitor 20.

The ILD 50 (also referred to as "the passivation layer") is above the cap layer 84. The ILD 50 may cover the MIM capacitor 20, the dielectric layer 30, and the cap layer 85. The ILD 50 may include un-doped silicate glass (USG), plasma enhanced deposited oxide (PEOX), or the like.

The conductive interconnections 60a and 60b (also referred to as "the conductive vias") may be electrically connected to the MIM capacitor 20. In some embodiments, the conductive interconnections 60a penetrates through the ILD 50, the cap layer 84, and the mask layer 85 to electrically connect to the conductive layer 20A (or the electrode) of the MIM capacitor 20. In some embodiments, the conductive interconnections 60b penetrates through the ILD 50, the cap layer 84, and the portion 20C2 of the dielectric layer 20C to electrically connect to the conductive layer 20B (or the electrode) of the MIM capacitor 20.

According to some embodiments of the present disclosure, with the arrangement of a dielectric layer interposed between the MOM capacitor(s) and the MIM capacitor, the overall capacitance density can be increased due to the parasitic capacitance generated, which is advantageous to increasing the operation voltage, for example, up to about 6V to about 10 V or higher.

Moreover, while the formation of MOM capacitors can be integrated into the current processes for metal line layers (e.g., the back-end-of-line (BEOL) processes), the MOM capacitors normally exhibit relatively low capacitance values; on the other hand, a MIM capacitor may have a relatively large capacitance value, yet the formation thereof requires additional manufacturing processes between the current processes for metal line layers (e.g., between the metal line M5 process and the metal line M6 process). According to some embodiments of the present disclosure, the combination of the MIM capacitor and the MOM capacitor can provide an increased capacitance value without significantly increasing the complexity as well as costs of the manufacturing process of the semiconductor structure. For example, an in-die or in-chip decoupling capacitor having a capacitance density value of greater than about 2 nF/mm$^2$ for high voltage devices (e.g., about 7V or 8V) can be obtained.

The numbers of the MOM capacitors, the MIM capacitor, and the fingers in each of the MOM capacitors shown in FIG. 1 are for illustrative purposes only. Numbers and configurations of the MOM capacitors, the MIM capacitor, and the fingers in each of the MOM capacitors other than those shown in FIG. 1 are within the contemplated scope of the present disclosure.

Figure 1A:
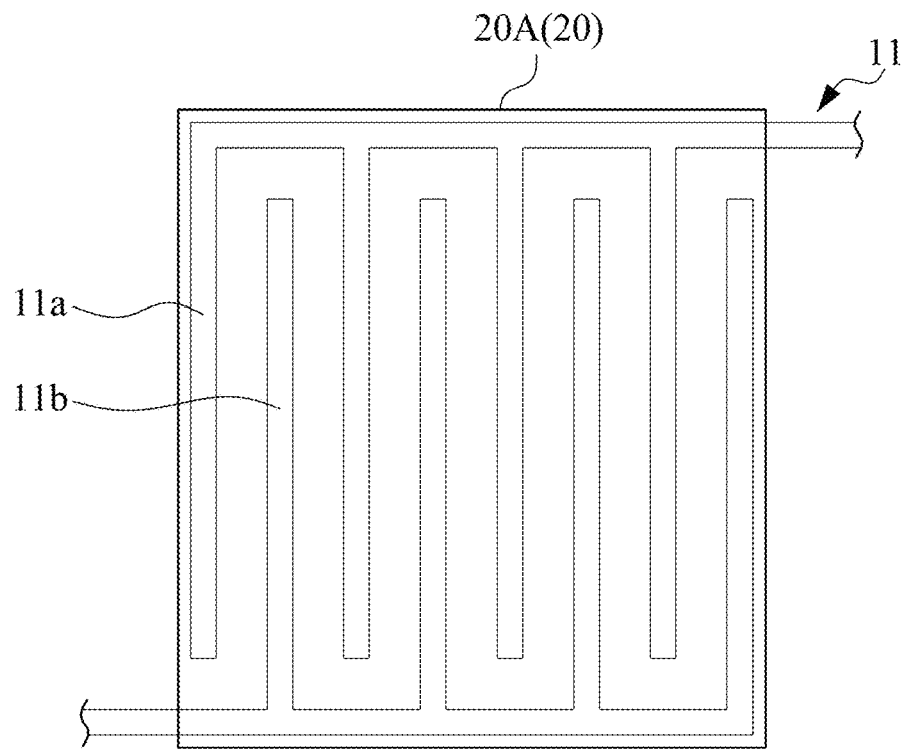
FIG. 1A is a top view of a portion of a semiconductor structure in accordance with some embodiments of the present disclosure.

FIG. 1A is a top view of a portion of a semiconductor structure in accordance with some embodiments of the present disclosure. In some embodiments, the MOM capacitor 11 and the MIM capacitor 20 included in the semiconductor structure 1 are shown in FIG. 1A as an example, but the present disclosure is not limited thereto.

Referring to FIG. 1A, the fingers 11a and the fingers 11b may be arranged in parallel and staggeredly. In some embodiments, referring to FIGS. 1 and 1A, the fingers 12a and the fingers 12b of the MOM capacitor 12 may be arranged in parallel and staggeredly in a fashion similar to that of the fingers 11a and 11b of the MOM capacitor 11. In some embodiments, referring to FIGS. 1 and 1A, the fingers 11a and the fingers 12a may be arranged in parallel.

In some embodiments, the MOM capacitor 11 and the MIM capacitor 20 overlap from a top view perspective. In some embodiments, the conductive layer 20A of the MIM capacitor 20 overlaps with the MOM capacitor 11 (or the metal-dielectric-metal layer) from a top view perspective. In some embodiments, a projection of the MOM capacitor 11 is within the conductive layer 20A of the MIM capacitor 20.

Figure 1B:
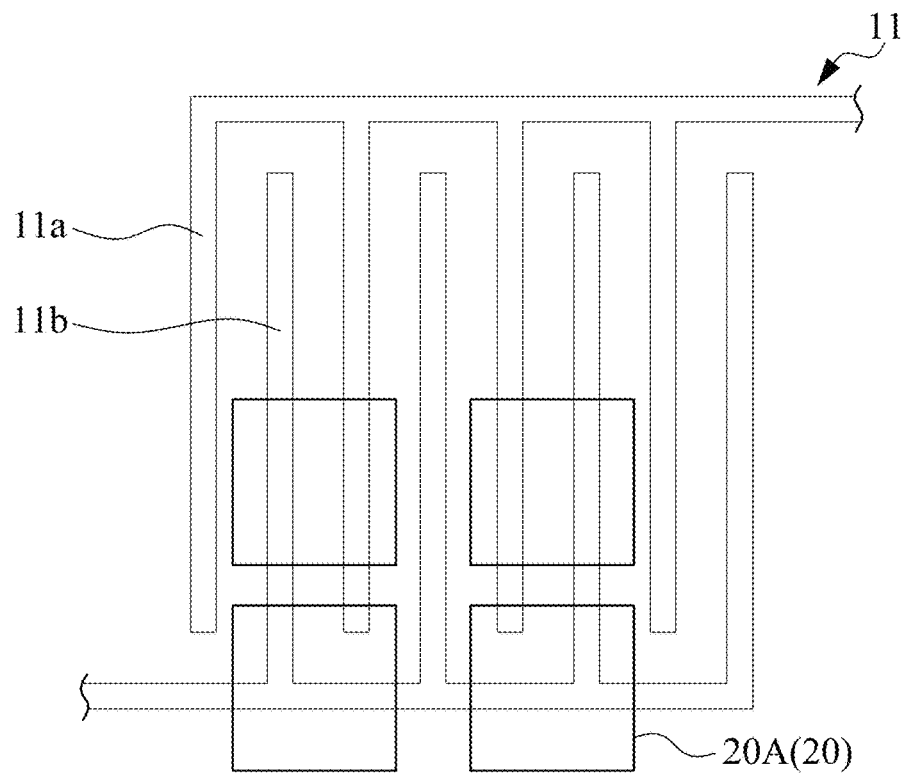
FIG. 1B is a top view of a portion of a semiconductor structure in accordance with some embodiments of the present disclosure.

FIG. 1B is a top view of a portion of a semiconductor structure in accordance with some embodiments of the present disclosure. In some embodiments, the MOM capacitor 11 and the MIM capacitor 20 included in the semiconductor structure 1 are shown in FIG. 1B as an example, but the present disclosure is not limited thereto.

In some embodiments, a projection of the MIM capacitor 20 is within the MOM capacitor 11. In some embodiments, projections of a plurality of the MIM capacitors 20 are within the MOM capacitor 11. In some embodiments, one or more MIM capacitors 20 overlap with the MOM capacitor 11 (or the metal-dielectric-metal layer) from a top view perspective. In some embodiments, one or more projections of the conductive layers 20A are within the MOM capacitor 11 (or the metal-dielectric-metal layer). In some embodiments, one or more projections of the conductive layers 20A overlap with the MOM capacitor 11 (or the metal-dielectric-metal layer) from a top view perspective.

Figure 1C:
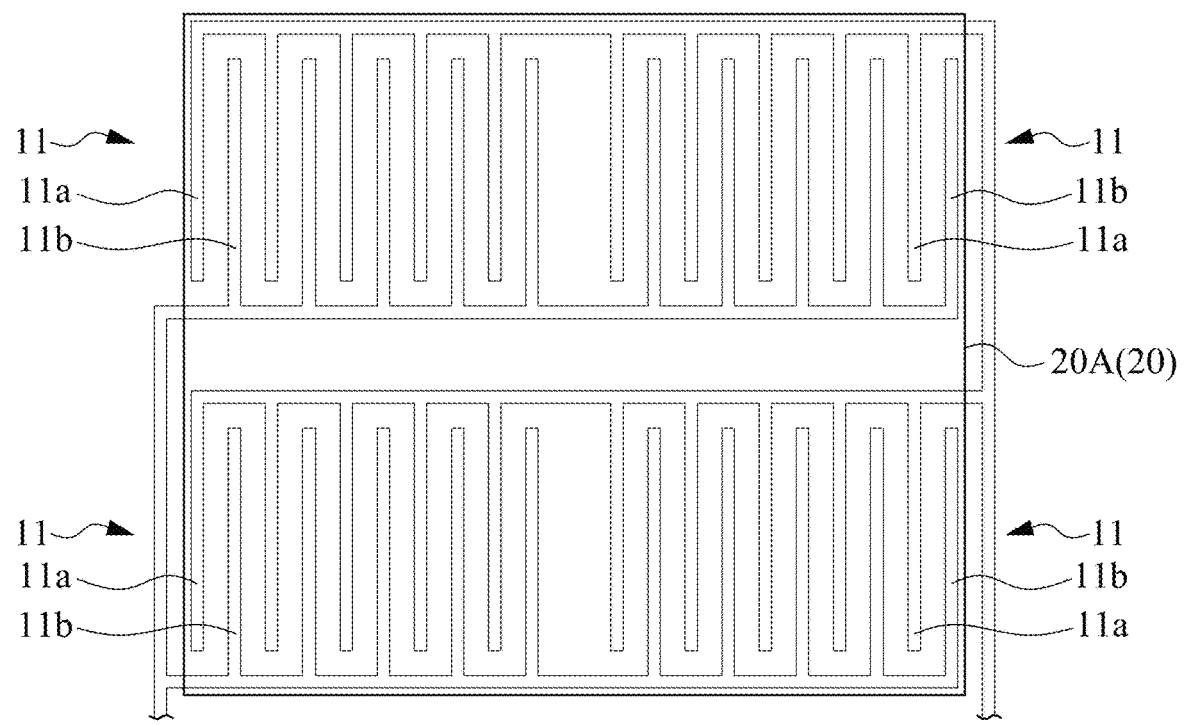
FIG. 1C is a top view of a portion of a semiconductor structure in accordance with some embodiments of the present disclosure.

FIG. 1C is a top view of a portion of a semiconductor structure in accordance with some embodiments of the present disclosure. In some embodiments, the MOM capacitor 11 and the MIM capacitor 20 included in the semiconductor structure 1 are shown in FIG. 1C as an example, but the present disclosure is not limited thereto.

In some embodiments, a plurality of the MOM capacitors 11 are substantially coplanar and overlap with the MIM capacitor 20 from a top view perspective. In some embodiments, a plurality of the MOM capacitors 11 are at substantially the same elevation and overlap with the MIM capacitor 20 from a top view perspective. In some embodiments, projections of one or more MOM capacitors 11 are within the MIM capacitor 20.

Figure 1D:
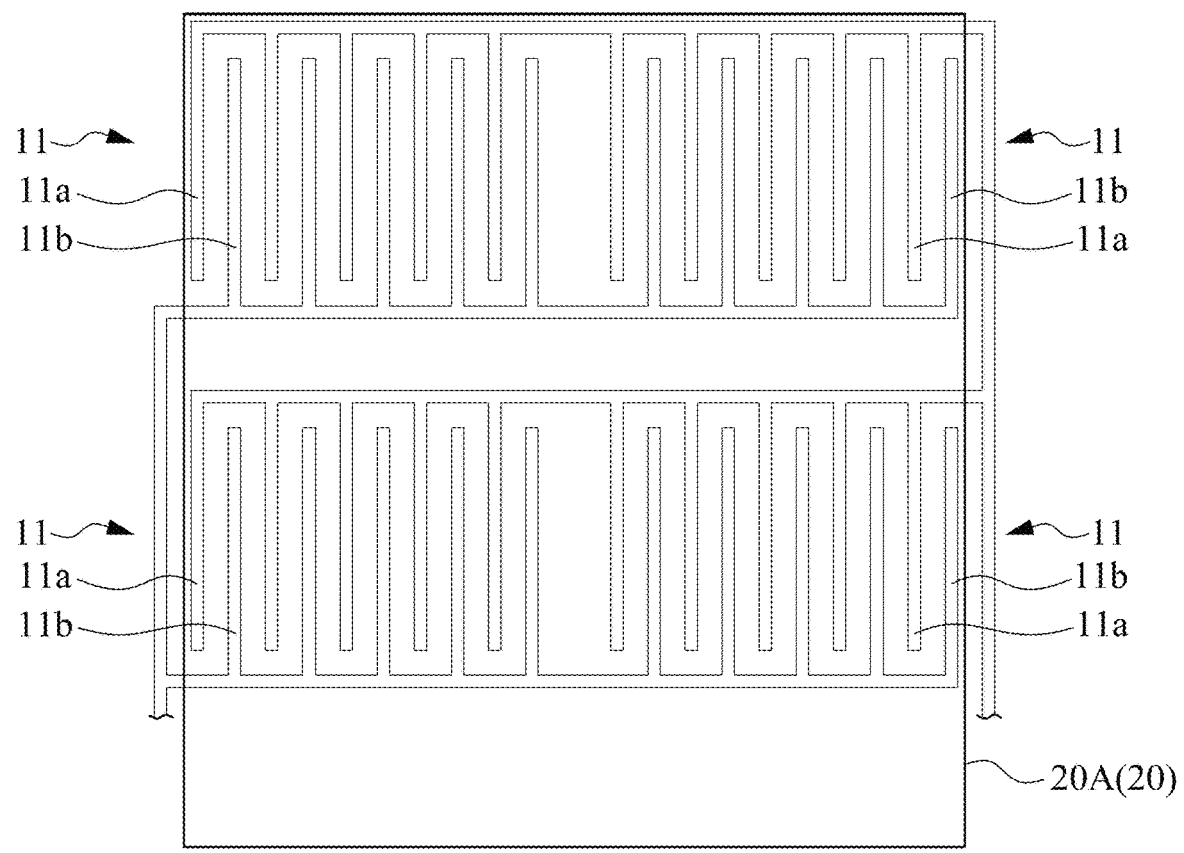
FIG. 1D is a top view of a portion of a semiconductor structure in accordance with some embodiments of the present disclosure.

FIG. 1D is a top view of a portion of a semiconductor structure in accordance with some embodiments of the present disclosure. In some embodiments, the MOM capacitor 11 and the MIM capacitor 20 included in the semiconductor structure 1 are shown in FIG. 1D as an example, but the present disclosure is not limited thereto.

In some embodiments, a plurality of the MOM capacitors 11 are at substantially the same elevation and overlap with the MIM capacitor 20 from a top view perspective. In some embodiments, the MOM capacitors 11 overlap a portion of the MIM capacitor 20 from a top view perspective.

According to some embodiments of the present disclosure, an increase in an overlapping area between the MIM capacitor and the MOM capacitor can result in an increase of the parasitic capacitance, thereby increasing the overall capacitance of the stack of the capacitors. Therefore, the overall capacitance density value may be adjusted according to actual applications by simply varying the overlapping area without increasing or decreasing the numbers of capacitors or capacitor structures to be formed. Therefore, the applicable range of the frequency of the noise to be decoupled may be increased without forming more or less numbers of capacitors and/or undesirably increasing the complexity of the manufacturing process of the semiconductor structure.

Figure 2A:
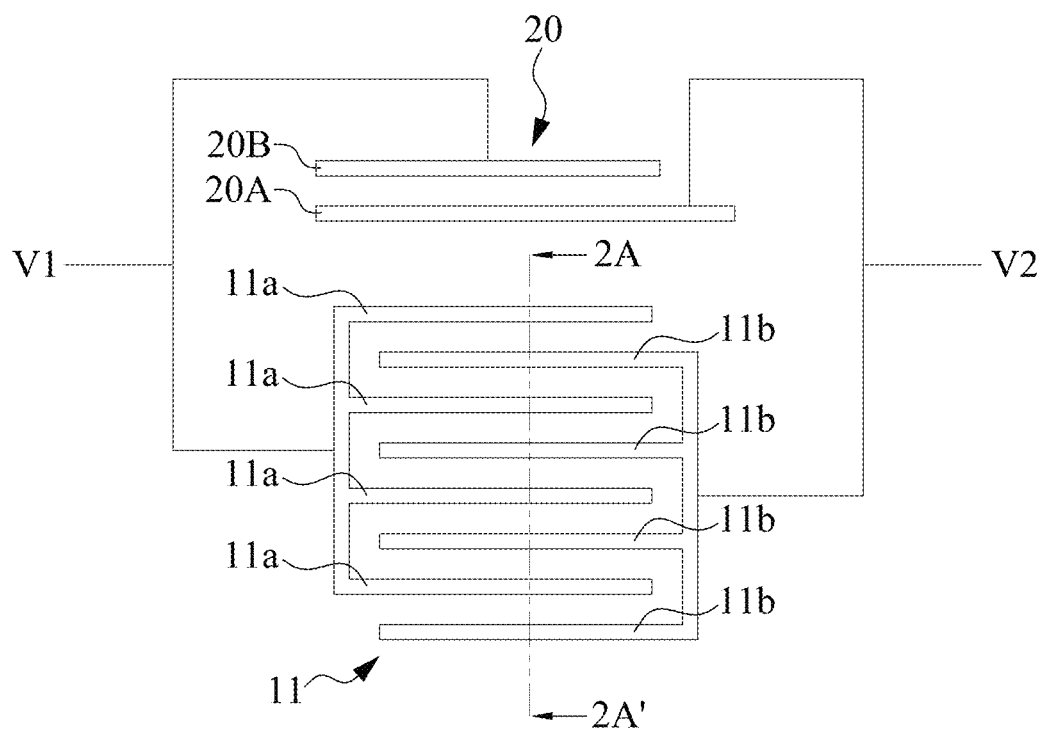
FIG. 2A is a diagram illustrating the electrical connection between a MOM capacitor and a MIM capacitor of a semiconductor structure in accordance with some embodiments of the present disclosure.

FIG. 2A is a diagram illustrating the electrical connection between a MOM capacitor and a MIM capacitor of a semiconductor structure in accordance with some embodiments of the present disclosure. In some embodiments, the MOM capacitor 11 and the MIM capacitor 20 included in the semiconductor structure 1 are shown in FIG. 2A as an example, but the present disclosure is not limited thereto. In some embodiments, a cross-sectional structure of the MIM capacitor along the cross-sectional line 2A-2A' may be shown in FIG. 1.

Referring to FIG. 2A, in some embodiments, the fingers 11a are electrically connected to a voltage V1, and the fingers 11b are electrically connected to a voltage V2 which is different from the voltage V1. In some embodiments, the conductive layer 20B is connected to the voltage V1, and the conductive layer 20A is connected to the voltage V2. In some embodiments, the MIM capacitor 20 and the MOM capacitor 11 are electrically connected in parallel. In some embodiments, the MIM capacitor 20 and the stack of the MOM capacitors 11-14 may be electrically connected in parallel. In some embodiments, the voltage V1 is higher than the voltage V2. In some embodiments, the voltage V1 is a positive voltage, and the voltage V2 is ground. In some embodiments, the capacitors that are electrically connected (e.g., the MOM capacitor 11 and the MIM capacitor 20) may serve as an in-die decoupling capacitor for one or more circuits corresponding to a portion or an entirety of a die formed from the semiconductor structure. In some embodiments, the MIM capacitor 20 and the MOM capacitor 11 electrically connected in parallel may have a capacitance density value from about 2 nF/mm$^2$ to about 3 nF/mm$^2$ under an operation voltage from about 6 V to about 10 V.

In some embodiments, the fingers 12a may be electrically connected to the voltage V1, and the fingers 12b may be electrically connected to the voltage V2. In some embodiments, the fingers 13a may be electrically connected to the voltage V1, and the fingers 13b may be electrically connected to the voltage V2. In some embodiments, the fingers 14a may be electrically connected to the voltage V1, and the fingers 14b may be electrically connected to the voltage V2.

Figure 2B:
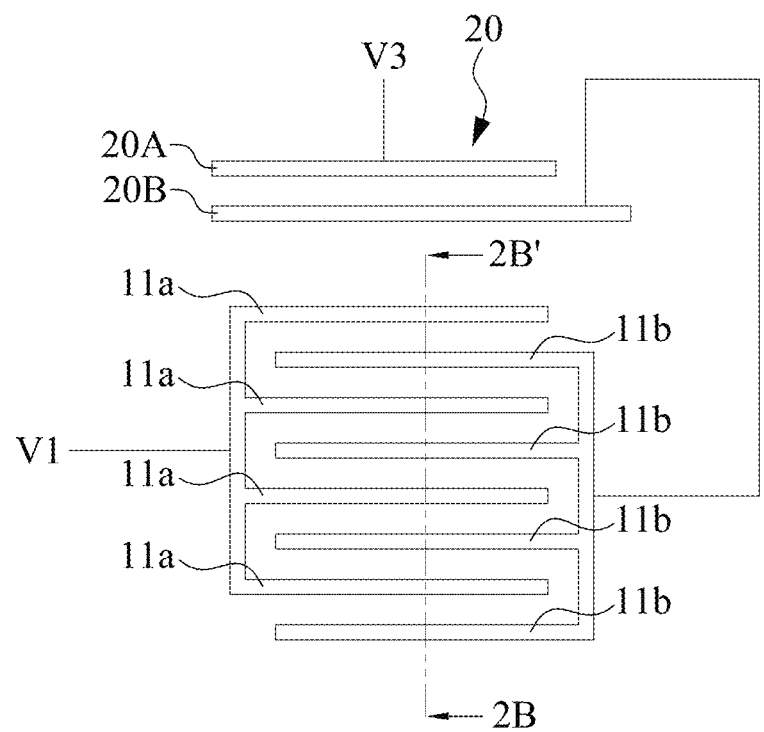
FIG. 2B is a diagram illustrating the electrical connection between a MOM capacitor and a MIM capacitor of a semiconductor structure in accordance with some embodiments of the present disclosure.

FIG. 2B is a diagram illustrating the electrical connection between a MOM capacitor and a MIM capacitor of a semiconductor structure in accordance with some embodiments of the present disclosure. In some embodiments, the MOM capacitor 11 and the MIM capacitor 20 included in the semiconductor structure 1 are shown in FIG. 2A as an example, but the present disclosure is not limited thereto. In some embodiments, a cross-sectional structure of the MIM capacitor along the cross-sectional line 2B-2B' may be shown in FIG. 1.

In some embodiments, the MIM capacitor 20 is electrically connected in series with the MOM capacitor 11. In some embodiments, the MIM capacitor 20 may be electrically connected in series with the stack of the MOM capacitors 11-14. In some embodiments, the conductive layer 20B is electrically connected to the fingers 11b of the MOM capacitor 11 (or the metal-dielectric-metal layer), and the conductive layer 20A is connected to a voltage V3 different from the voltage V1. In some embodiments, the voltage V1 is higher than the voltage V3. In some embodiments, the voltage V1 is a positive voltage, and the voltage V3 is ground. In some embodiments, the MIM capacitor 20 and the MOM capacitor 11 electrically connected in series may have a capacitance density value from about 1 nF/mm$^2$ to about 1.5 nF/mm$^2$ under an operation voltage from about 12 V to about 20 V.

According to some embodiments of the present disclosure, the overall capacitance may be adjusted by varying the number of each type of the capacitors as well as selecting to electrically connect the MIM capacitor and the MOM capacitor in parallel or in series, so as to achieve a desired capacitance value for decoupling signals having a predetermined frequency value or range from a voltage supply. Therefore, the power signal can be stabilized, and the noise can be reduced.

Figure 3:
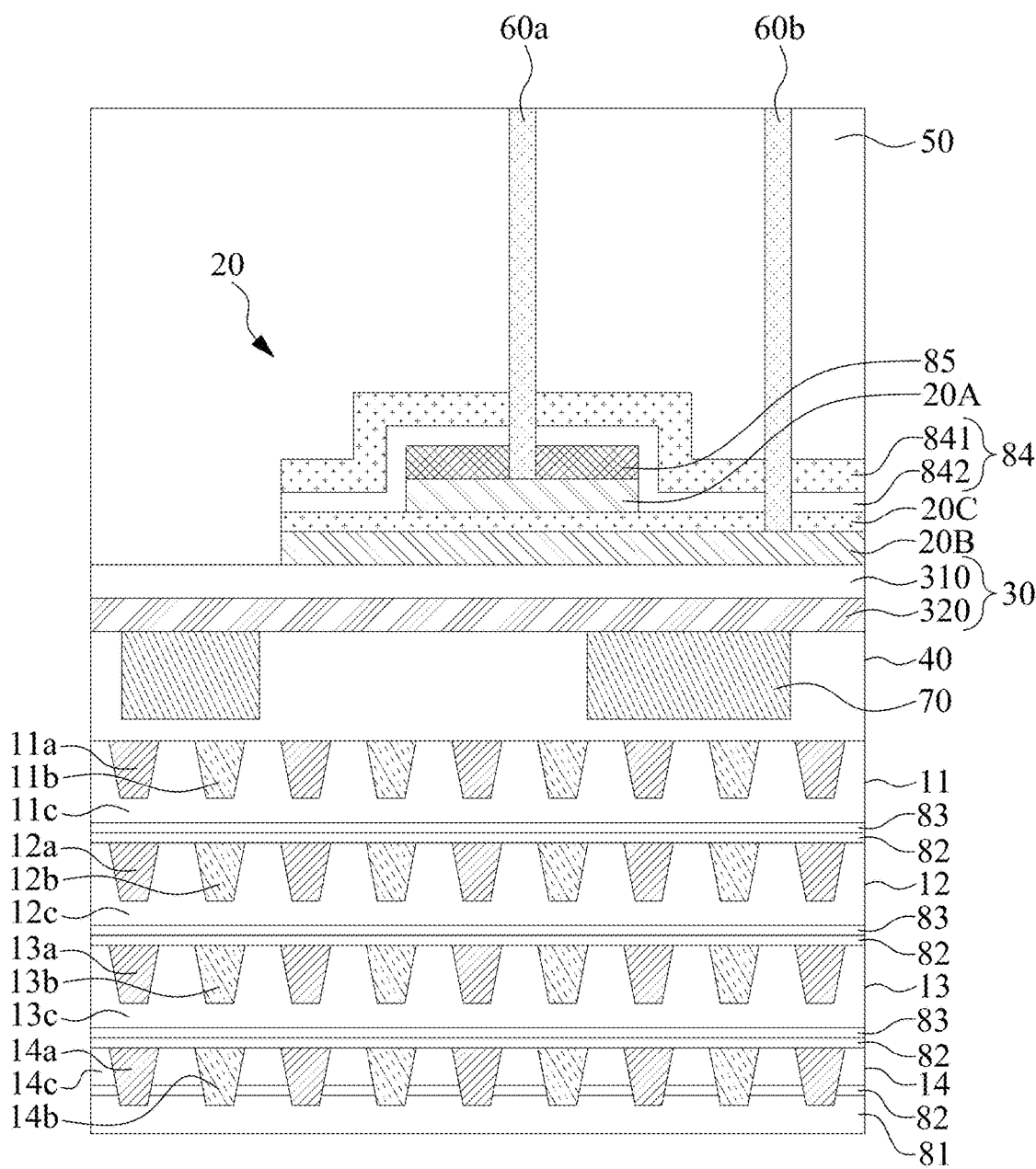
FIG. 3 is a cross-sectional view of a semiconductor structure in accordance with some embodiments of the present disclosure.

FIG. 3 is a cross-sectional view of a semiconductor structure 3 in accordance with some embodiments of the present disclosure. The semiconductor structure 3 is similar to the semiconductor structure 1 in many aspects, and thus descriptions of these aspects are not repeated for brevity. Referring to FIG. 3, the semiconductor structure 3 differs from the semiconductor structure 1 in, for example, the configurations of the MIM capacitor 20.

In some embodiments, the dielectric layer 30 includes sub-layers 310 and 320. In some embodiments, the sub-layer 320 of the dielectric layer 30 is on the MOM capacitor 11 (or the metal-dielectric-metal layer). In some embodiments, the sub-layer 310 of the dielectric layer 30 is between the sub-layer 320 of the dielectric layer 30 and the conductive layer 20B. In some embodiments, the sub-layer 310 of the dielectric layer 30 is proximal to the MIM capacitor 20, and the sub-layer 320 of the dielectric layer 30 is proximal to the MOM capacitor 11.

In some embodiments, the sub-layer 310 of the dielectric layer 30 includes an oxide layer, and the sub-layer 320 of the dielectric layer 30 includes silicon carbide, silicon nitride, or a combination thereof. In some embodiments, a thickness of the dielectric layer 30 ranges from about 900 Å to about 1900 Å. In some embodiments, a thickness of the sub-layer 310 of the dielectric layer 30 ranges from about 500 Å to about 2000 Å. In some embodiments, a thickness of the sub-layer 310 of the dielectric layer 30 is about 1000 Å. In some embodiments, a thickness of the sub-layer 320 of the dielectric layer 30 is about 900 Å. In some embodiments, a thickness of the sub-layer 320 of the dielectric layer 30 ranges from about 500 Å to about 2000 Å.

In some embodiments, the cap layer 84 includes sub-layers 841 and 842. The sub-layer 841 and the sub-layer 842 may include different materials. In some embodiments, the sub-layer 841 includes silicon nitride, and the sub-layer 842 includes silicon oxide. In some embodiments, the sub-layer 841 and the ILD 50 include different materials.

Figure 4:
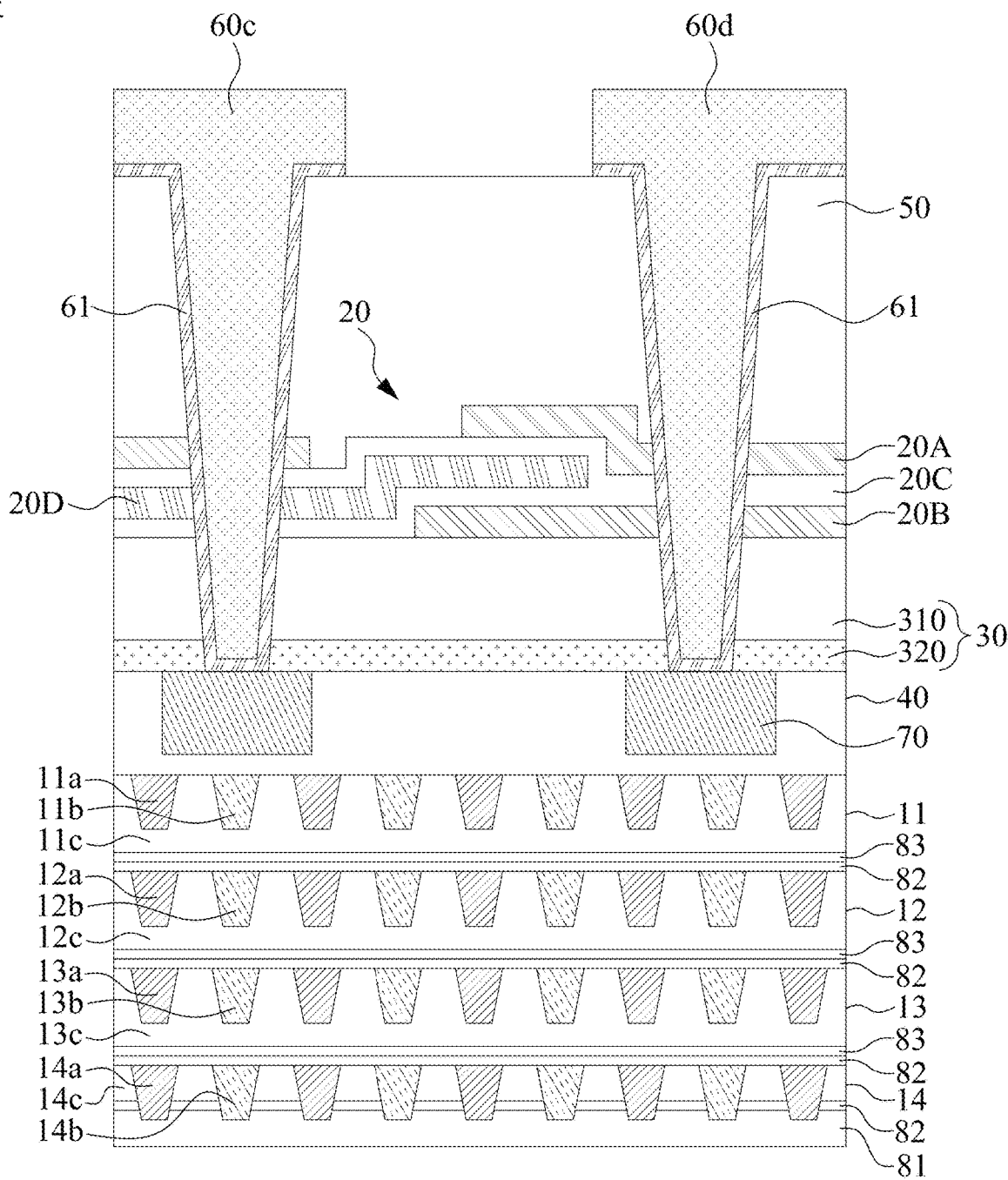
FIG. 4 is a cross-sectional view of a semiconductor structure in accordance with some embodiments of the present disclosure.

FIG. 4 is a cross-sectional view of a semiconductor structure 4 in accordance with some embodiments of the present disclosure. The semiconductor structure 4 is similar to the semiconductor structure 1 in many aspects, and thus descriptions of these aspects are not repeated for brevity. Referring to FIG. 4, the semiconductor structure 4 differs from the semiconductor structure 1 in, for example, the configurations of the MIM capacitor 20.

In some embodiments, the MIM capacitor 20 includes conductive layers 20A, 20B and 20D, and the dielectric layer 20C is between the conductive layers 20A, 20B and 20D. In some embodiments, the dielectric layer 20C separates the conductive layer 20B (also referred to as "the bottom terminal") from the conductive layer 20D (also referred to as "the middle terminal"), and separates the conductive layer 20D from the conductive layer 20A (also referred to as "the top terminal"). In some embodiments, the dielectric layer 20C provides a separation spacing between each of the conductive layers.

The conductive layers 20A, 20B and 20D may include conductive materials, such as TiN, Ti, Al, TaN, Ta, Cu, W, indium tin oxide (ITO), tungsten nitride (WN), rhenium trioxide (ReO$_3$), rhenium oxide (ReO$_2$), iridium oxide (IrO$_2$), ruthenium (Ru), osmium (Os), palladium (Pd), platinum (Pt), molybdenum nitride (MoN), molybdenum (Mo), a conductive metal, the combination thereof, or the like.

In some embodiments, the conductive interconnections 60c and 60d penetrate through the ILD 50 and taper toward the metal layer 70. In some embodiments, the conductive interconnection 60c is electrically connected to the conductive layer 20D, and the conductive interconnection 60d is connected to the conductive layers 20A and 20B, thereby different voltages can be applied separately to the conductive layer 20D and the conductive layers 20A and 20B, respectively.

In some embodiments, the semiconductor structure 4 may further include a barrier layers 61 adhering and spacing between the sidewall of the conductive interconnection 60c and the ILD 50 as well as the sidewall of the conductive interconnection 60d and the ILD 50. The barrier layer 61 may include Ta, TaN, TiN, a combination thereof, or the like.

Figure 5:
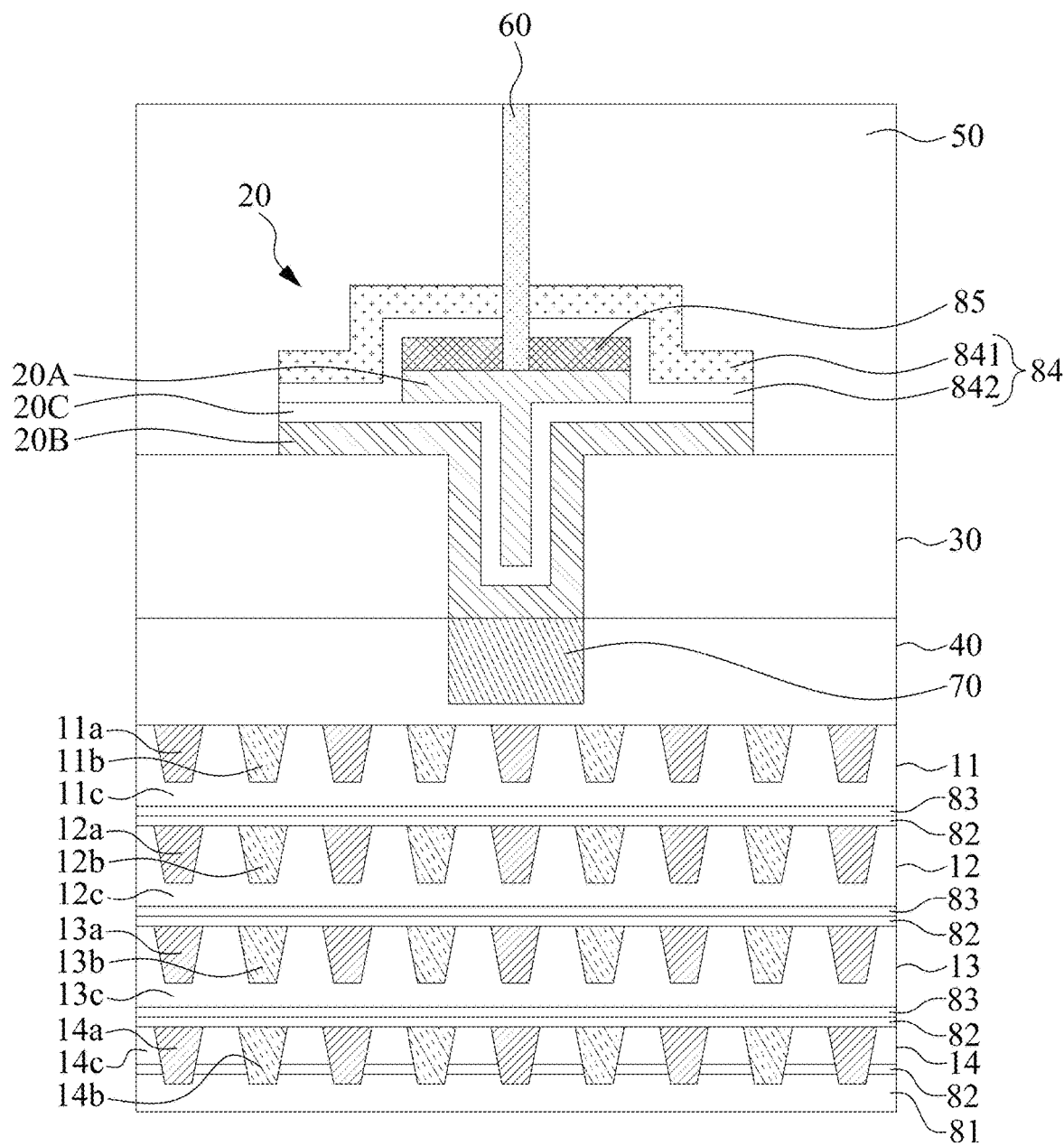
FIG. 5 is a cross-sectional view of a semiconductor structure in accordance with some embodiments of the present disclosure.

FIG. 5 is a cross-sectional view of a semiconductor structure 5 in accordance with some embodiments of the present disclosure. The semiconductor structure 5 is similar to the semiconductor structure 4 in many aspects, and thus descriptions of these aspects are not repeated for brevity. Referring to FIG. 5, the semiconductor structure 5 differs from the semiconductor structure 4 in, for example, the MIM capacitor 20 may be a deep trench capacitor (DTC).

In some embodiments, the dielectric layer 30 defines a trench, and portions of the conductive layers 20A and 20B and the dielectric layer 20C are filled in the trench. In some embodiments, the conductive interconnection 60 penetrates through the ILD 50, the cap layer 84, and the mask layer 85 to electrically connect to the conductive layer 20A (or the electrode). In some embodiments, the conductive layer 20B (or the electrode) electrically connects to the metal layer 70.

In some embodiments, the dielectric layer 20C may include molding compounds, pre-impregnated composite fibers (e.g., pre-preg) BPSG, silicon oxide, silicon nitride, silicon oxynitride, USG, any combination thereof, or the like. Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

FIGS. 6A to 6I are cross-sectional views of intermediate stages of a method of manufacturing a semiconductor structure in accordance with some embodiments of the present disclosure.

Figure 6A:
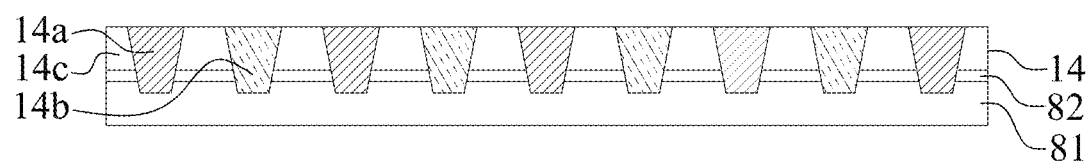
FIGS. 6A to 6I are cross-sectional views of intermediate stages of a method of manufacturing a semiconductor structure in accordance with some embodiments of the present disclosure.

Referring to FIG. 6A, an etch stop layer 82 is formed over an ILD 81, a dielectric material 14c is formed over the etch stop layer 82, and a patterned metal layer including the fingers 14a and 14b are formed in the dielectric layer 14c. In some embodiments, the fingers 14a are spaced apart from and in parallel to the fingers 14b. In some embodiments, the dielectric material 14c is between the fingers 14a and the fingers 14b. The dielectric layer 14c may be formed by spin coating, deposition, plasma enhanced deposition, or the like. The fingers 14a and 14b may be formed by a variety of techniques, e.g., single and/or dual damascene processes, electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. A planarization operation, such as chemical mechanical planarization (CMP) operation, may be performed on the top surfaces of the fingers 14a, the fingers 14b, and the dielectric layer 14c. As such, a MOM capacitor 14 (or a metal-dielectric-metal layer) is formed.

Figure 6B:
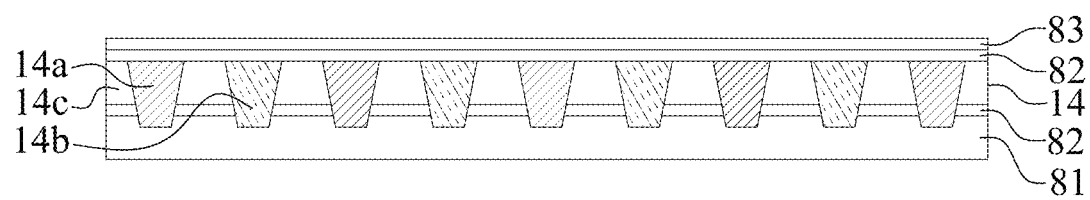

Referring to FIG. 6B, an etch stop layer 82 is formed on the fingers 14a, the fingers 14b, and the dielectric layer 14c, and a liner 83 is formed on the etch stop layer 82. The liner 83 may be formed by spin coating, deposition, plasma enhanced deposition, or the like.

Figure 6C:
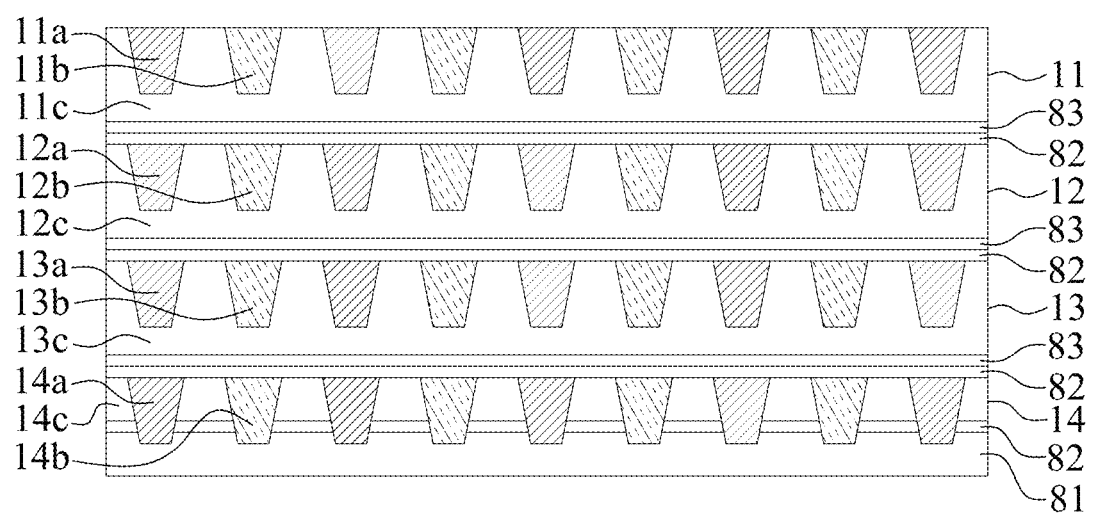

Referring to FIG. 6C, operations similar to those illustrated in FIGS. 6A-6B are performed to form dielectric materials 11c-13c, patterned metal layers each including two sets of fingers, etch stop layers 82, and liners 83, and thus the MOM capacitors 11-14 are formed as stack illustrated in FIG. 6C.

Figure 6D:
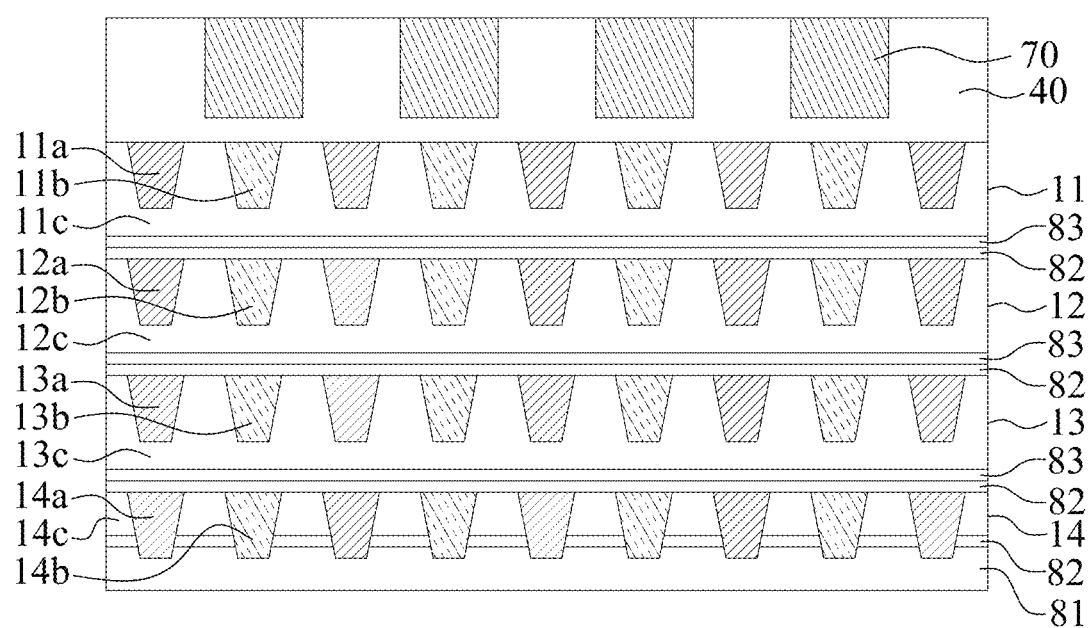

Referring to FIG. 6D, a dielectric layer 40 is formed on the fingers 11a and 11b and the dielectric material 11c, and a metal layer 70 including a plurality of metal lines is formed within the dielectric layer 40. The dielectric layer 40 may be composed of glass, such as un-doped silicate glass (USG), or the like. In some other embodiments, the dielectric layer 40 may be composed of oxide layer, such as plasma enhanced deposited oxide, or the like. In some embodiments, the dielectric layer 40 may be formed by spin coating, deposition, plasma enhanced deposition, or the like. The metal layer 70 may be formed by operations similar to those for forming the fingers 11a and 11b.

Figure 6E:
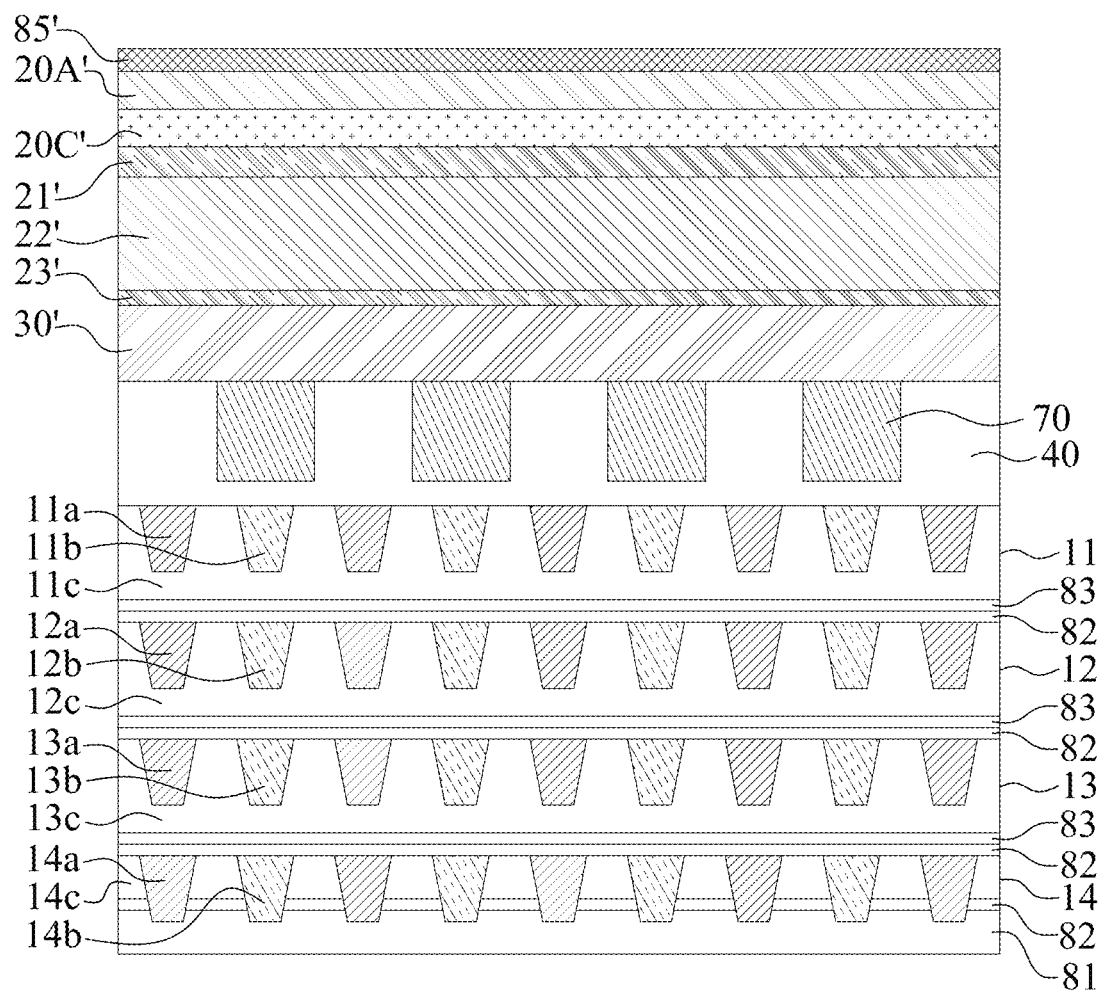

Referring to FIG. 6E, a dielectric layer 30' is formed over the metal layer 70, conductive layers 23', 22', and 21' are formed over the dielectric layer 30', a dielectric layer 20C' is formed over the conductive layer 21', a conductive layer 20A' is formed over the dielectric layer 20C', and a mask layer 85' is formed over the conductive layer 20A'. The aforesaid layers may be formed by one or more suitable deposition operations, for example, spin coating, deposition, or plasma enhanced deposition for dielectric layers, and electroplating, electroless plating, high-density IMP deposition, high-density ICP deposition, sputtering, PVD, CVD, LPCVD, or PECVD for conductive layers.

Figure 6F:
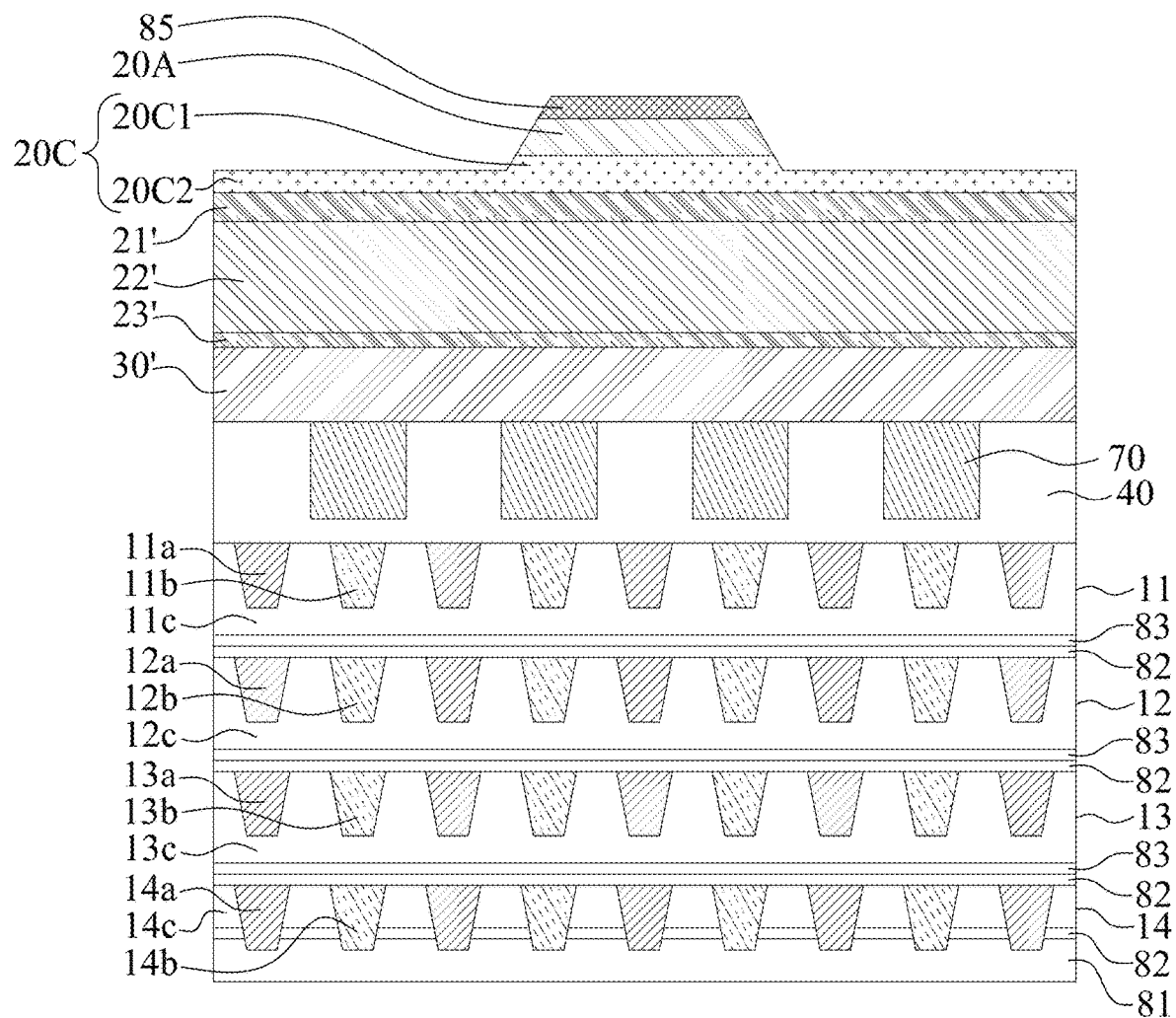

Referring to FIG. 6F, the mask layer 85' is patterned to form a mask layer 85, and a patterning operation is performed on the conductive layer 20A' and the dielectric layer 20C' according to the mask layer 85 to form a conductive layer 20A and a dielectric layer 20C. The patterning operation on the mask layer 85' may be performed by photolithography and etching. A portion of the dielectric layer 20C' may be removed by etching so as to form the dielectric layer 20C having a stepped structure including portions 20C1 and 20C2.

Figure 6G:
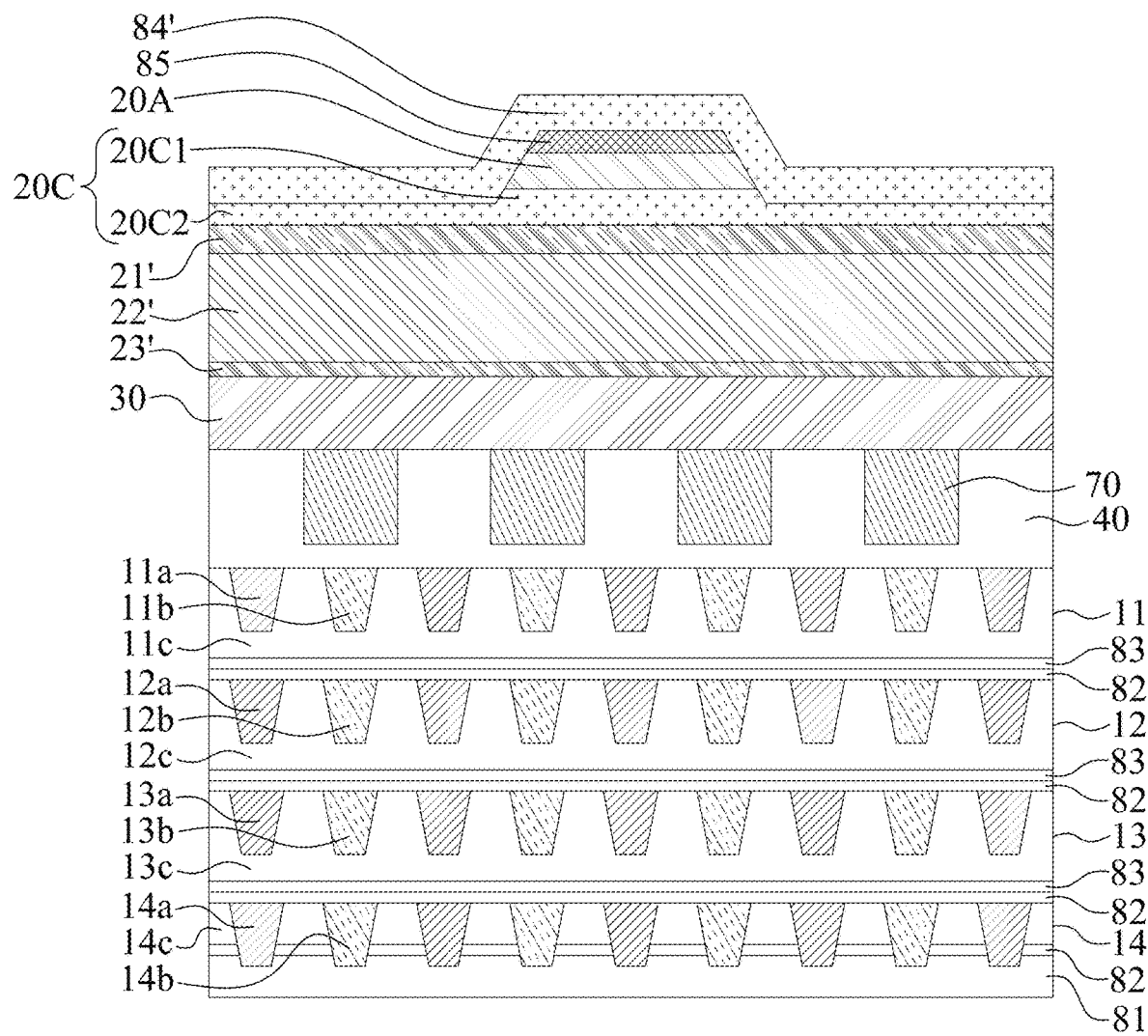

Referring to FIG. 6G, a cap layer 84' is formed over the mask layer 85, the conductive layer 20A, and the dielectric layer 20C. The cap layer 84' may be formed by spin coating, deposition, plasma enhanced deposition, or the like.

Referring to FIG. 6G, the cap layer 84', the dielectric layer 20C, the conductive layers 21', 22', and 23', and the dielectric layer 30' are patterned to form the cap layer 84, the dielectric layer 20C, the conductive layers 21, 22, and 23, and the dielectric layer 30, an ILD 50 is formed over the cap layer 84, the dielectric layer 20C, the conductive layers 21, 22, and 23, and the dielectric layer 30, and via trenches 60a' and 60b' are formed within the ILD 50 to expose a portion of the conductive layer 20A and a portion of the conductive layer 20B. The patterning operation may be performed by the following steps. A photomask (not shown) may be disposed over the cap layer 84', and portions of the cap layer 84', the dielectric layer 20C, the conductive layers 21', 22', and 23', and the dielectric layer 30' exposed from the photomask are removed to form the cap layer 84, the dielectric layer 20C, the conductive layers 21, 22, and 23, and the dielectric layer 30, then the photomask is removed.

Figure 6H:
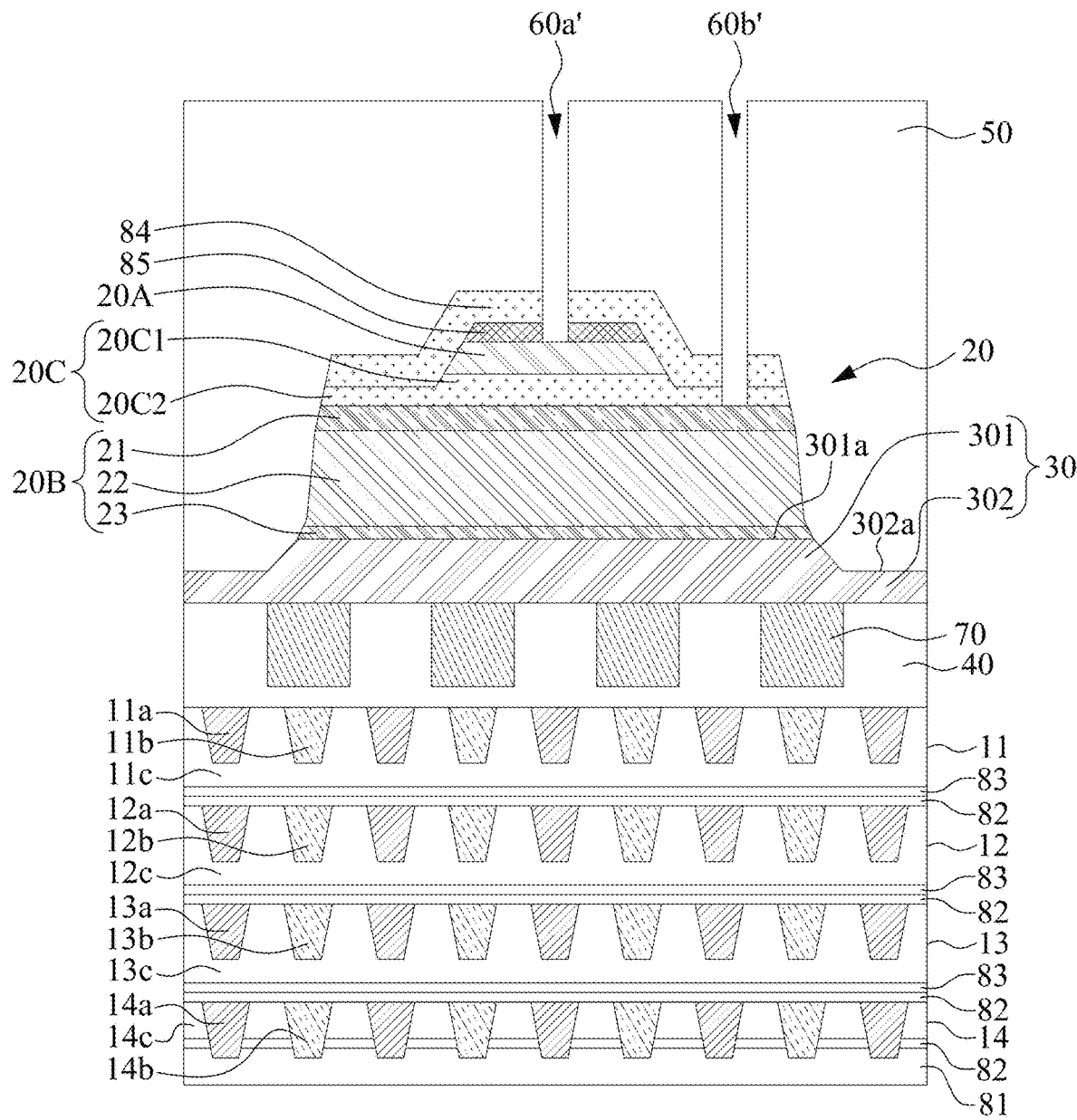
Figure 6I:
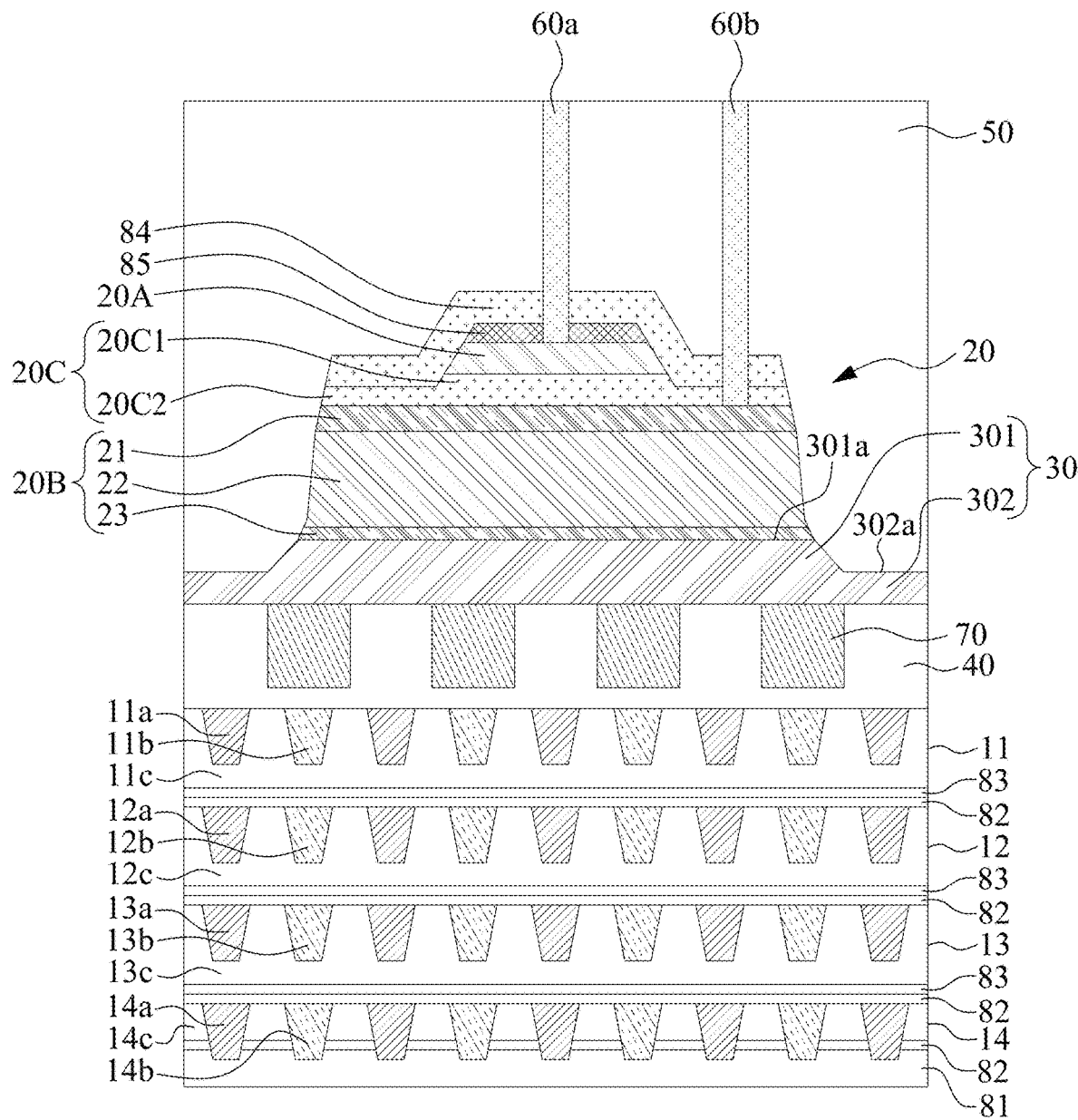

Referring to FIG. 6I, a conductive material is formed in the via trenches 60a' and 60b' to form conductive interconnections 60a and 60b. The conductive material can formed by a variety of techniques, e.g., deposition, electro plating, electro-less plating, sputtering, PVD, atomic layer deposition (ALD), or the like. In some embodiments, the conductive material is or includes AlCu. In some embodiments, a planarization operation is performed to remove the excessive conductive material above a top surface of ILD 50.

FIGS. 7A to 7E are cross-sectional views of intermediate stages of a method of manufacturing a semiconductor structure in accordance with some embodiments of the present disclosure.

Figure 7A:
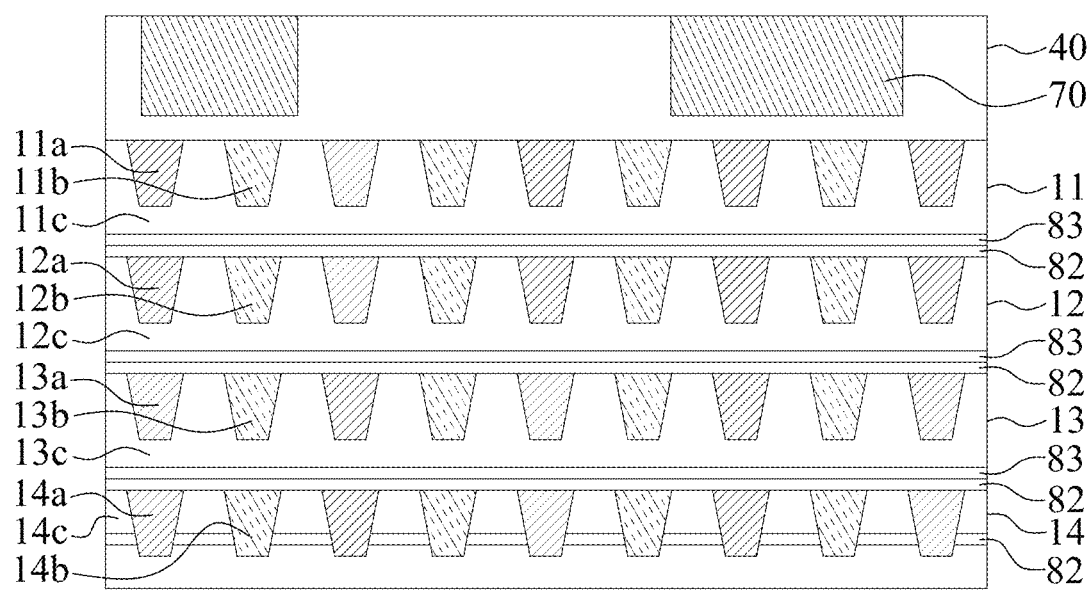
FIGS. 7A to 7E are cross-sectional views of intermediate stages of a method of manufacturing a semiconductor structure in accordance with some embodiments of the present disclosure.

Referring to FIG. 7A, operations similar to those illustrated in FIGS. 6A-6D are performed to form a stack of MOM capacitors 11-14, a dielectric layer 40, and a metal layer 70 including a plurality of metal lines within the dielectric layer 40.

Figure 7B:
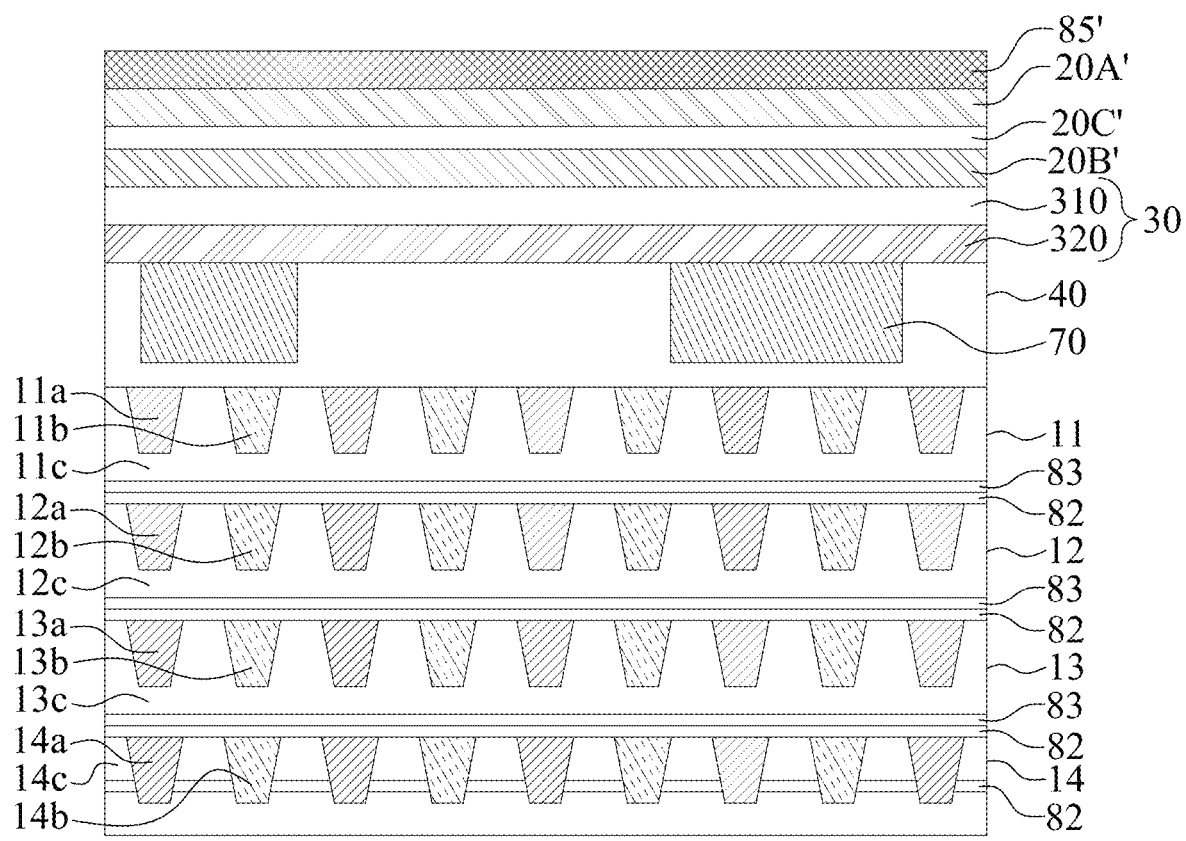

Referring to FIG. 7B, operations similar to those illustrated in FIG. 6E are performed to form a dielectric layer 30' over the metal layer 70, a conductive layer 20B' over the dielectric layer 30', a dielectric layer 20C' over the conductive layer 20B', a conductive layer 20A' over the dielectric layer 20C', and a mask layer 85' over the conductive layer 20A'. In some embodiments, forming the dielectric layer 30 including forming a sub-layer 320 over the fingers 11a and 11b and the dielectric material 11c; and forming a sub-layer 310 on the sub-layer 320. The sub-layers 310 and 320 may be formed by one or more suitable deposition operations, for example, spin coating, deposition, or plasma enhanced deposition.

Figure 7C:
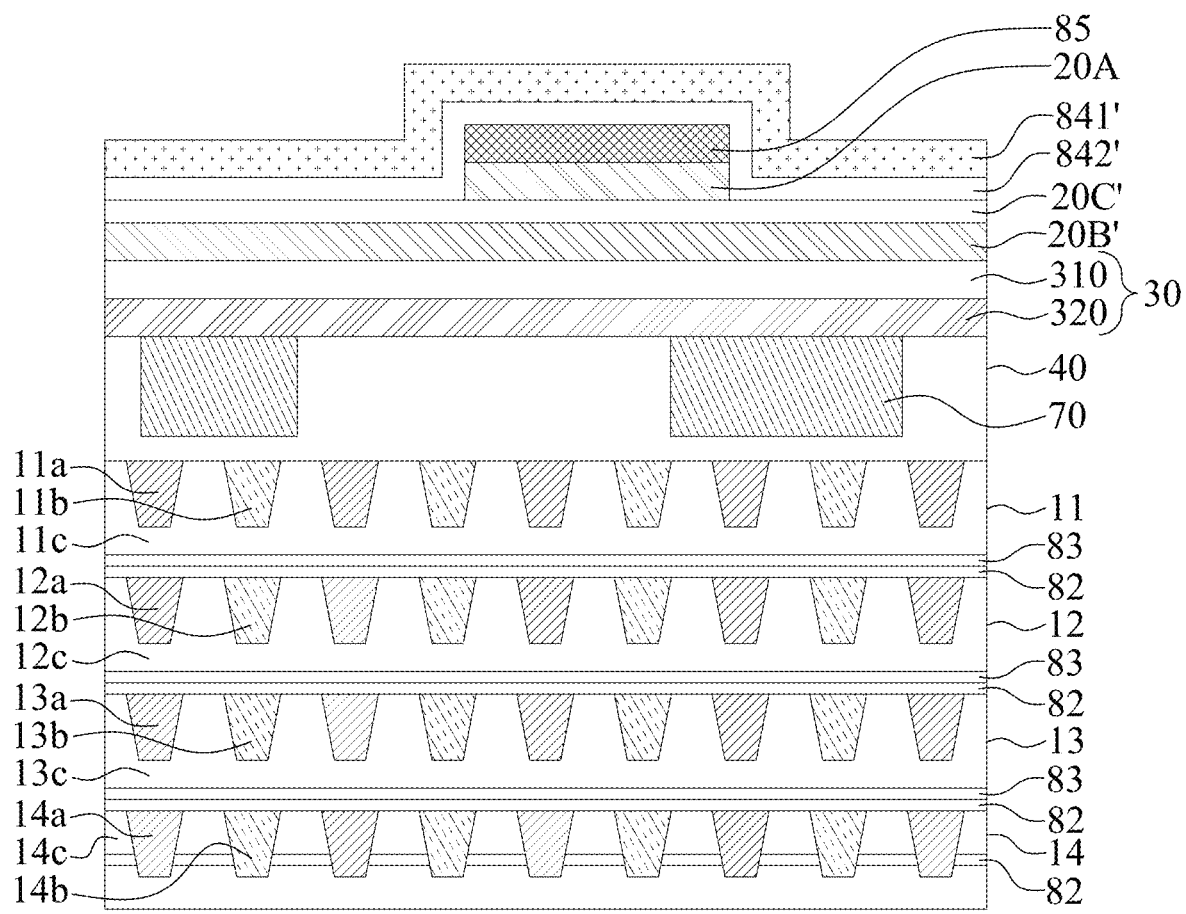

Referring to FIG. 7C, operations similar to those illustrated in FIGS. 6F-6G are performed to form a patterned mask layer 85, a conductive layer 20A, and a cap layer 84' over the mask layer 85 and the conductive layer 20A. In some embodiments, the cap layer 84' is formed by forming a sub-layer 842' over the mask layer 85, the conductive layer 20A, and the dielectric layer 20C, and forming a sub-layer 841' on the sub-layer 841'. The sub-layers 841' and 842' may be formed by one or more suitable deposition operations, for example, spin coating, deposition, or plasma enhanced deposition.

Figure 7D:
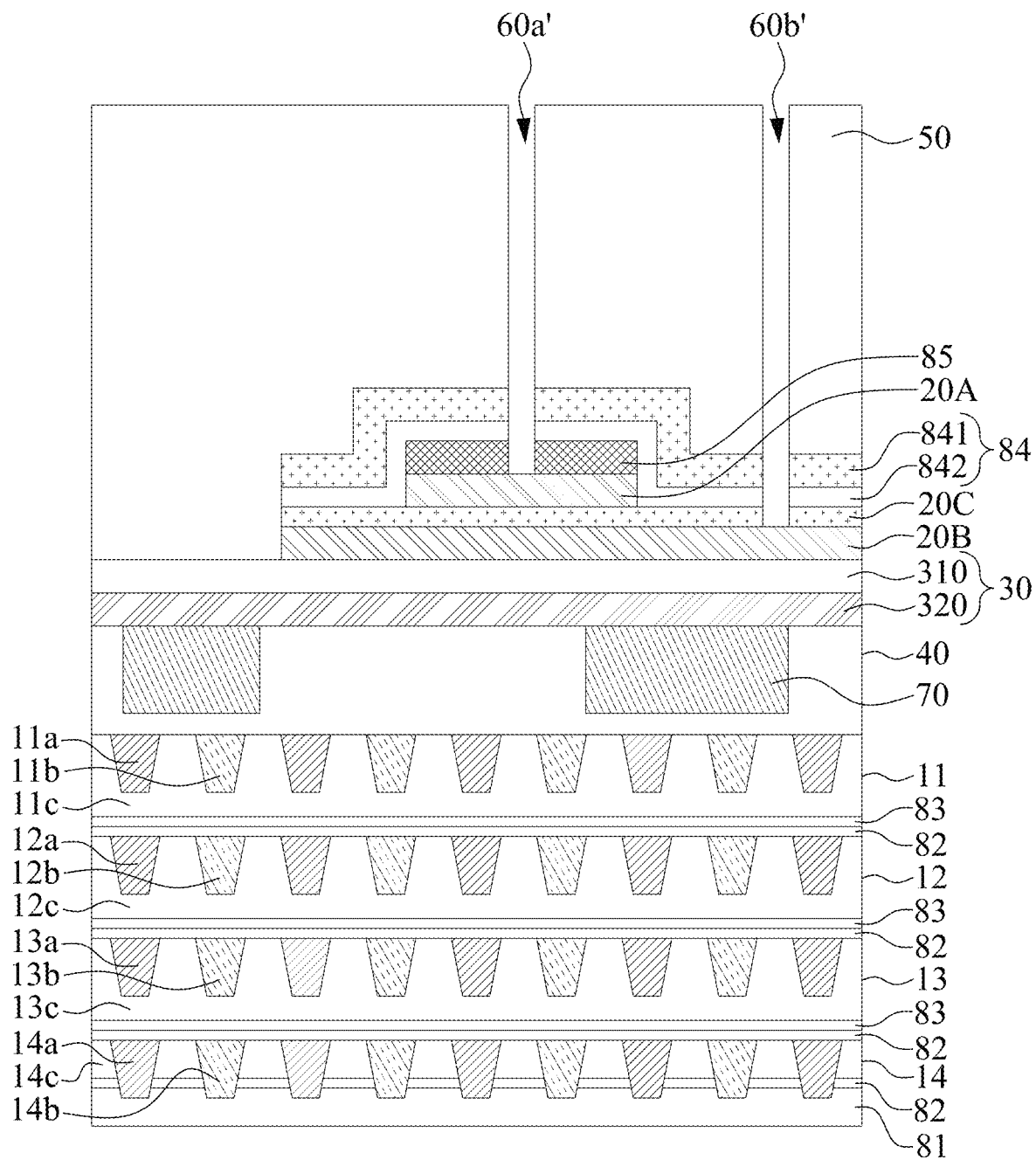

Referring to FIG. 7D, operations similar to those illustrated in FIG. 6H are performed to form the cap layer 84 including sub-layers 841 and 842, the dielectric layer 20C, and the conductive layer 20B, an ILD 50 is formed over the cap layer 84, the dielectric layer 20C, the conductive layer 20B, and the dielectric layer 30, and via trenches 60a' and 60b' are formed within the ILD 50 to expose a portion of the conductive layer 20A and a portion of the conductive layer 20B.

Figure 7E:
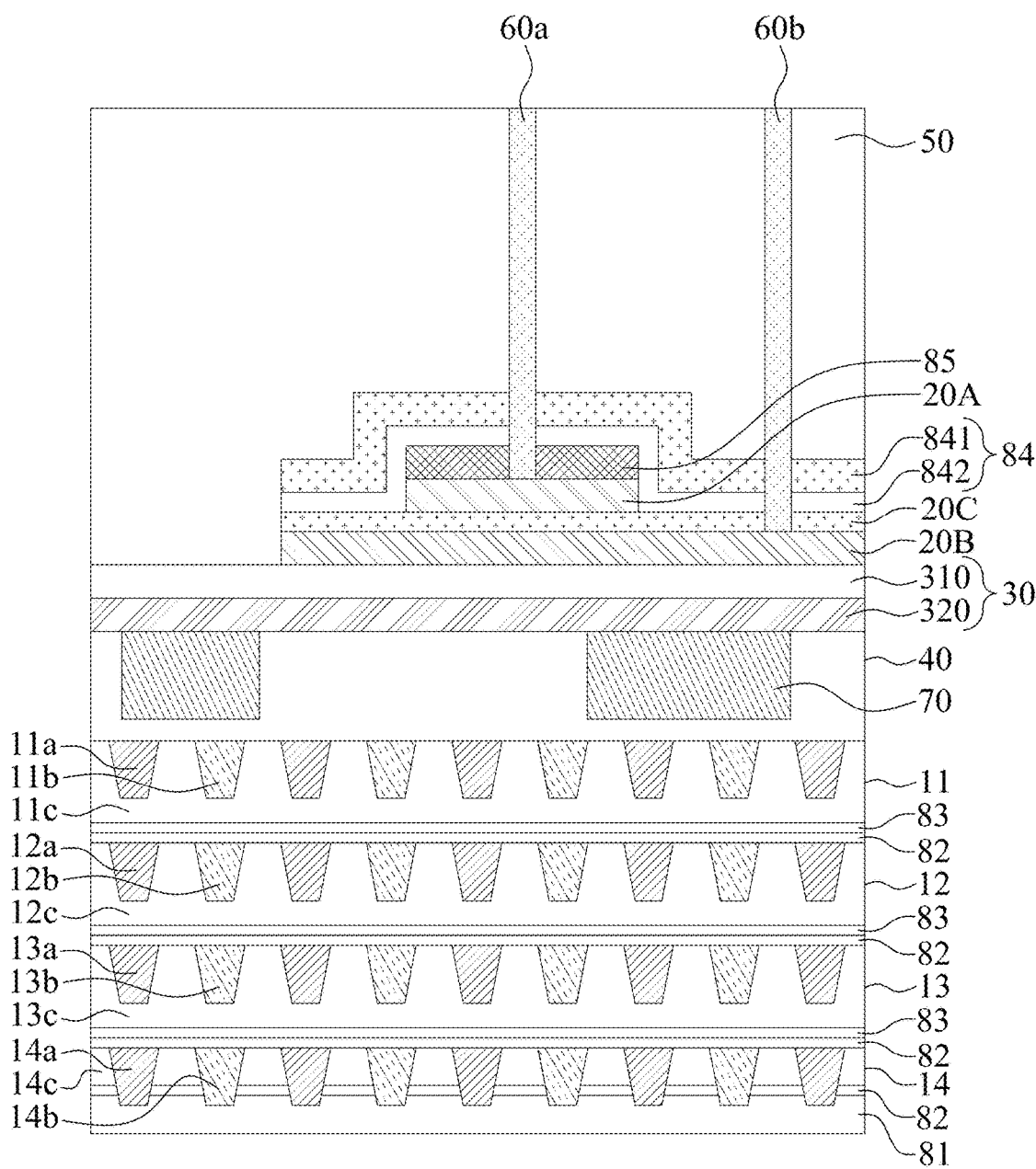

Referring to FIG. 7E, operations similar to those illustrated in FIG. 6I are performed to form conductive interconnections 60a and 60b.

FIGS. 8A to 8E are cross-sectional views of intermediate stages of a method of manufacturing a semiconductor structure in accordance with some embodiments of the present disclosure.

Figure 8A:
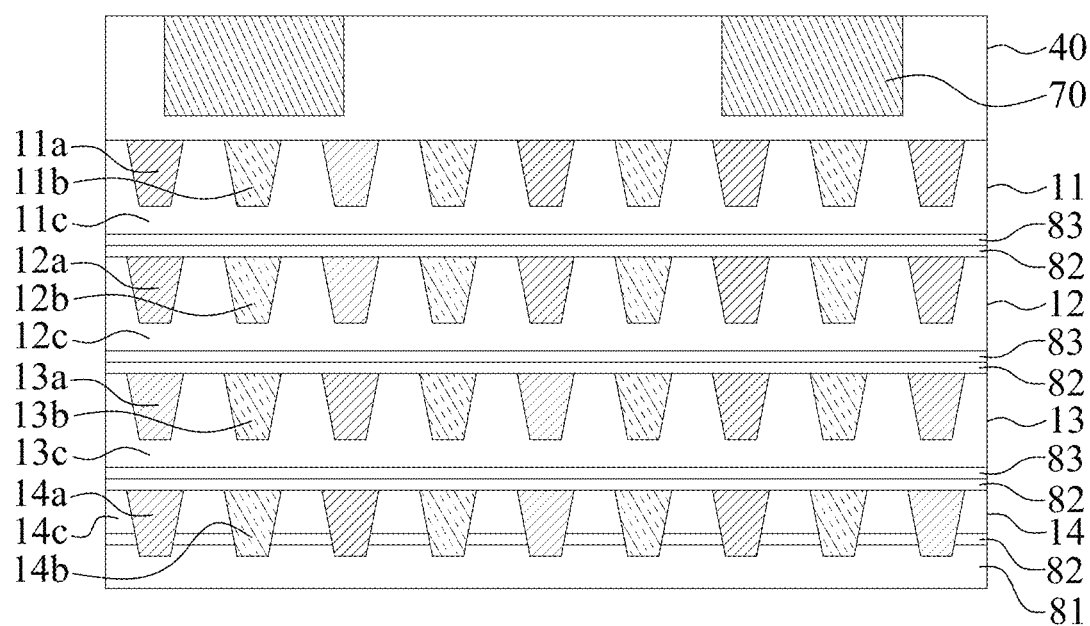
FIGS. 8A to 8E are cross-sectional views of intermediate stages of a method of manufacturing a semiconductor structure in accordance with some embodiments of the present disclosure.

Referring to FIG. 8A, operations similar to those illustrated in FIGS. 6A-6D are performed to form a stack of MOM capacitors 11-14, a dielectric layer 40, and a metal layer 70 including a plurality of metal lines within the dielectric layer 40.

Figure 8B:
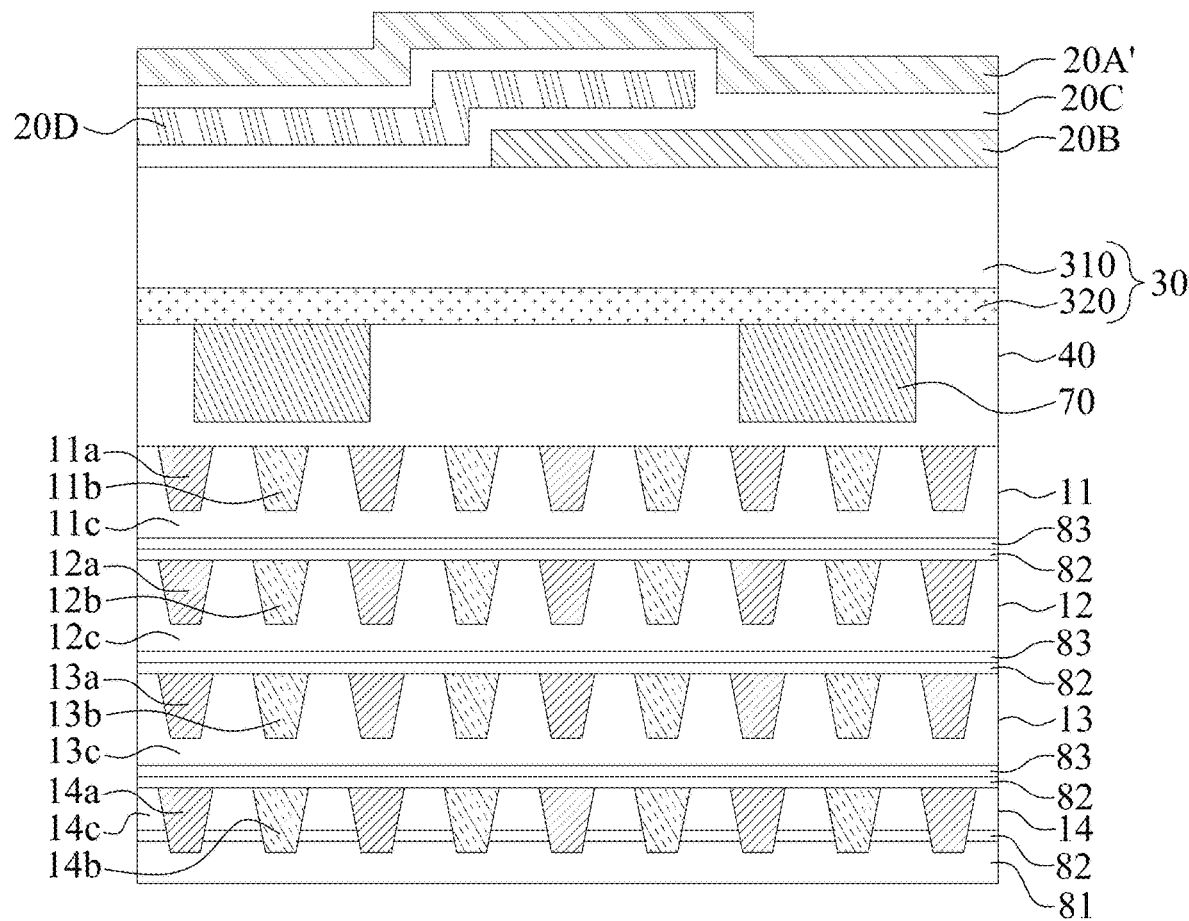

Referring to FIG. 8B, a dielectric sub-layer 320 is formed over the fingers 11a and 11b and the dielectric material 11c, and a dielectric sub-layer 310 is formed on the sub-layer 320. The sub-layers 310 and 320 may be formed by one or more suitable deposition operations, for example, spin coating, deposition, or plasma enhanced deposition.

Still referring to FIG. 8B, conductive layers 20A', 20B and 20D and a dielectric layer 20C are formed on the dielectric layer 30. In some embodiments, the conductive layer 20B is disposed above the dielectric layer 30, herein the conductive layer 20B covers at least a portion of a region of a top surface of the dielectric layer 30, as at least another portion of the top surface of the dielectric layer 30 is exposed from the conductive layer 20B. The top surface of the dielectric layer 30 exposing from the conductive layer 20B is covered by the dielectric layer 20C. In some embodiments, the forming of the dielectric layer 30 may include laminating $ZrO_2$—$Al_2O_3$—$ZrO_2$ tri-layer. The conductive layer 20D has a portion overlapping the conductive layer 20B and a portion directly on the dielectric layer 30, herein the dielectric layer 30 is formed above the conductive layer 20B, spacing between the conductive layer 20D and the conductive layer 20B. The dielectric layer 30 is further formed above and covering the conductive layer 20D. The conductive layer 20A' is further formed above the dielectric layer 30 over the conductive layers 20B and 20D.

Figure 8C:
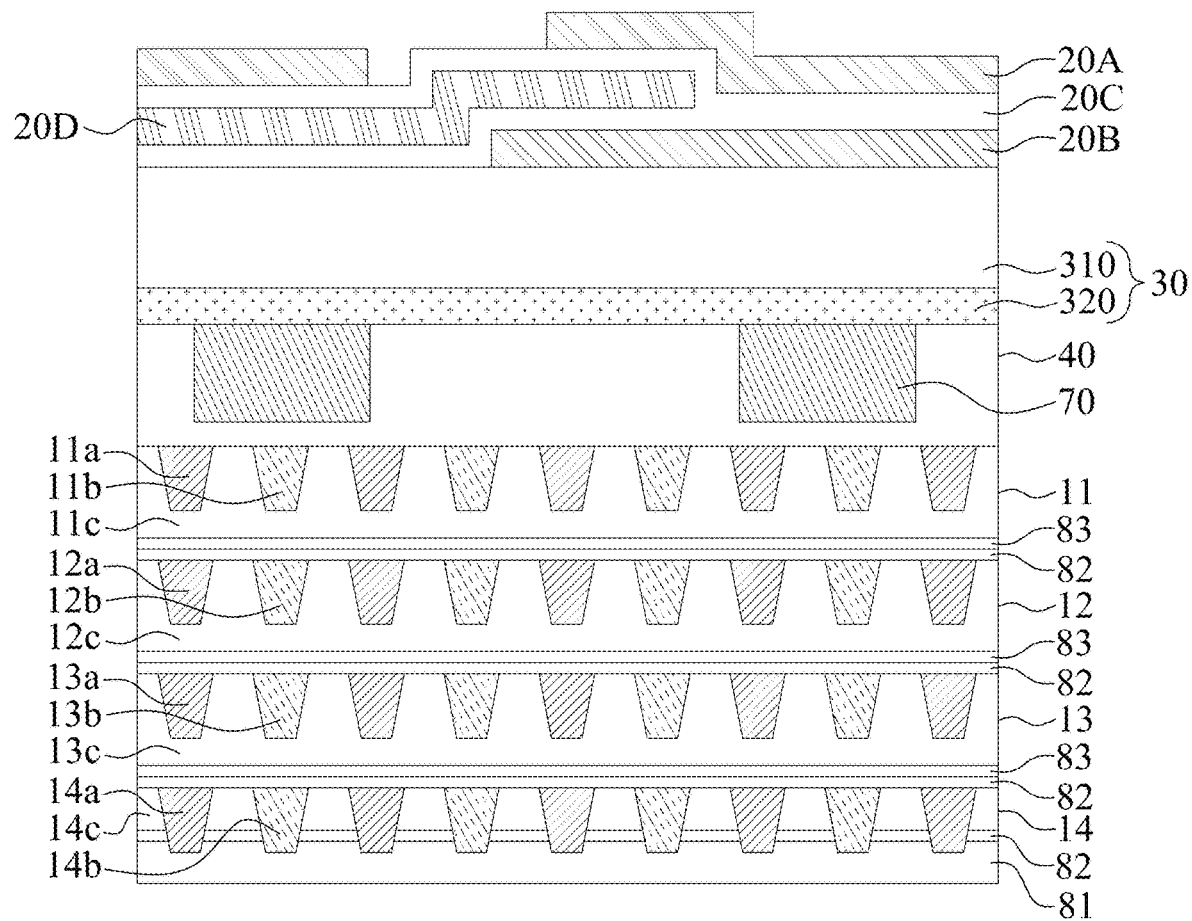

Referring to FIG. 8C, at least a portion of the conductive layer 20A' is removed to form a conductive layer 20A. The remained portions of the conductive layers 20A, 20B and 20D together with the dielectric layer 20C form a MIM capacitor structure.

Figure 8D:
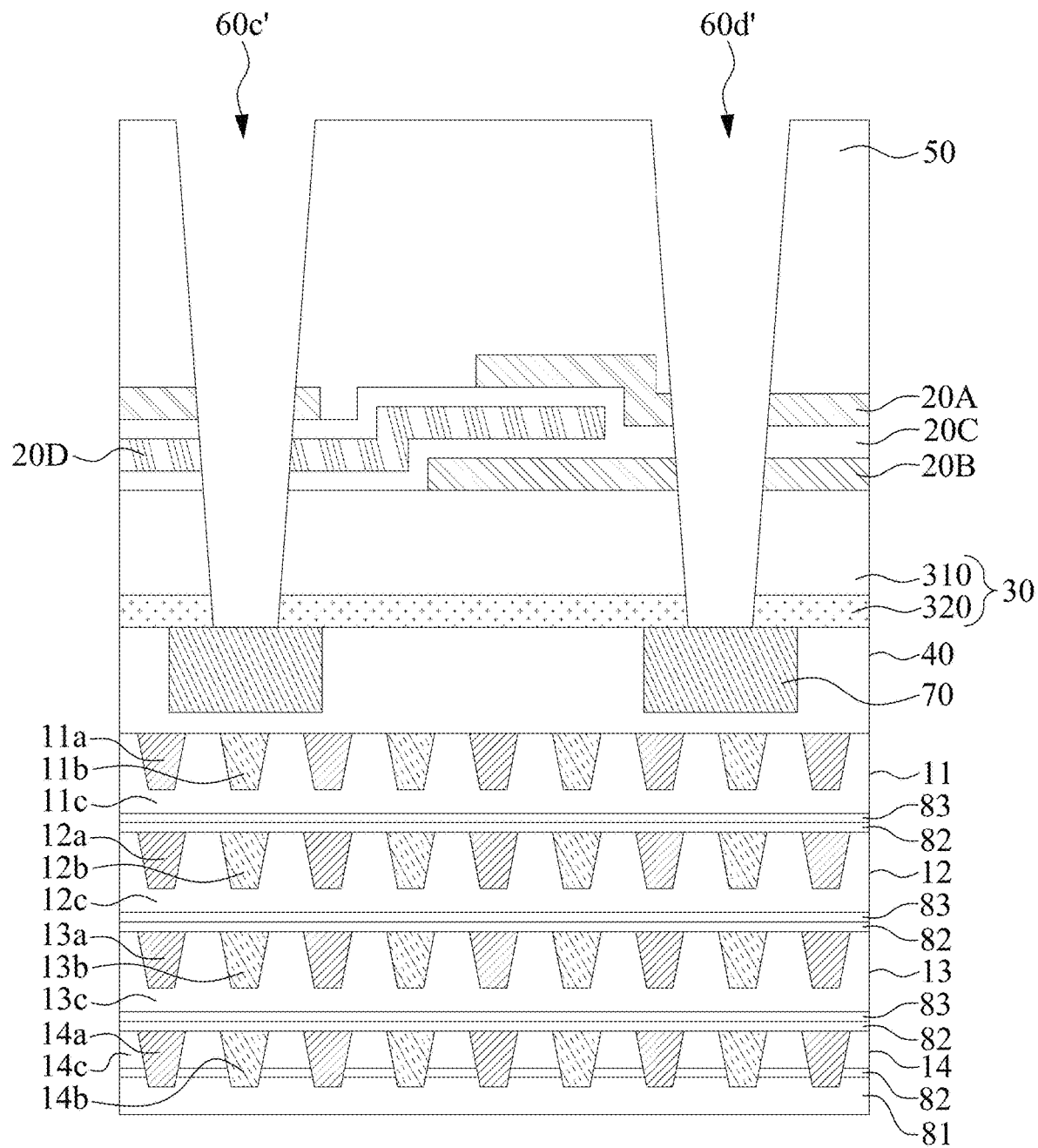

Referring to FIG. 8D, an ILD 50 is formed above the conductive layers 20A, 20B and 20D and the dielectric layer 20C. The ILD 50 may be formed by a variety of techniques, e.g., spin-on coating, deposition, plasma enhanced deposition, or the like.

Still referring to FIG. 8D, via trenches 60c' and 60d' are formed above the metal lines of the metal layer 70 by, for example, dry etching operation. The via trench 60c' penetrates the ILD 50, the conductive layer 20A, the dielectric layer 20C, the conductive layer 20D, and the dielectric layer 30 including sub-layers 310 and 320. The via trench 60d' penetrates the ILD 50, the conductive layer 20A, the dielectric layer 20C, the conductive layer 20B, and the dielectric layer 30 including sub-layers 310 and 320.

Figure 8E:
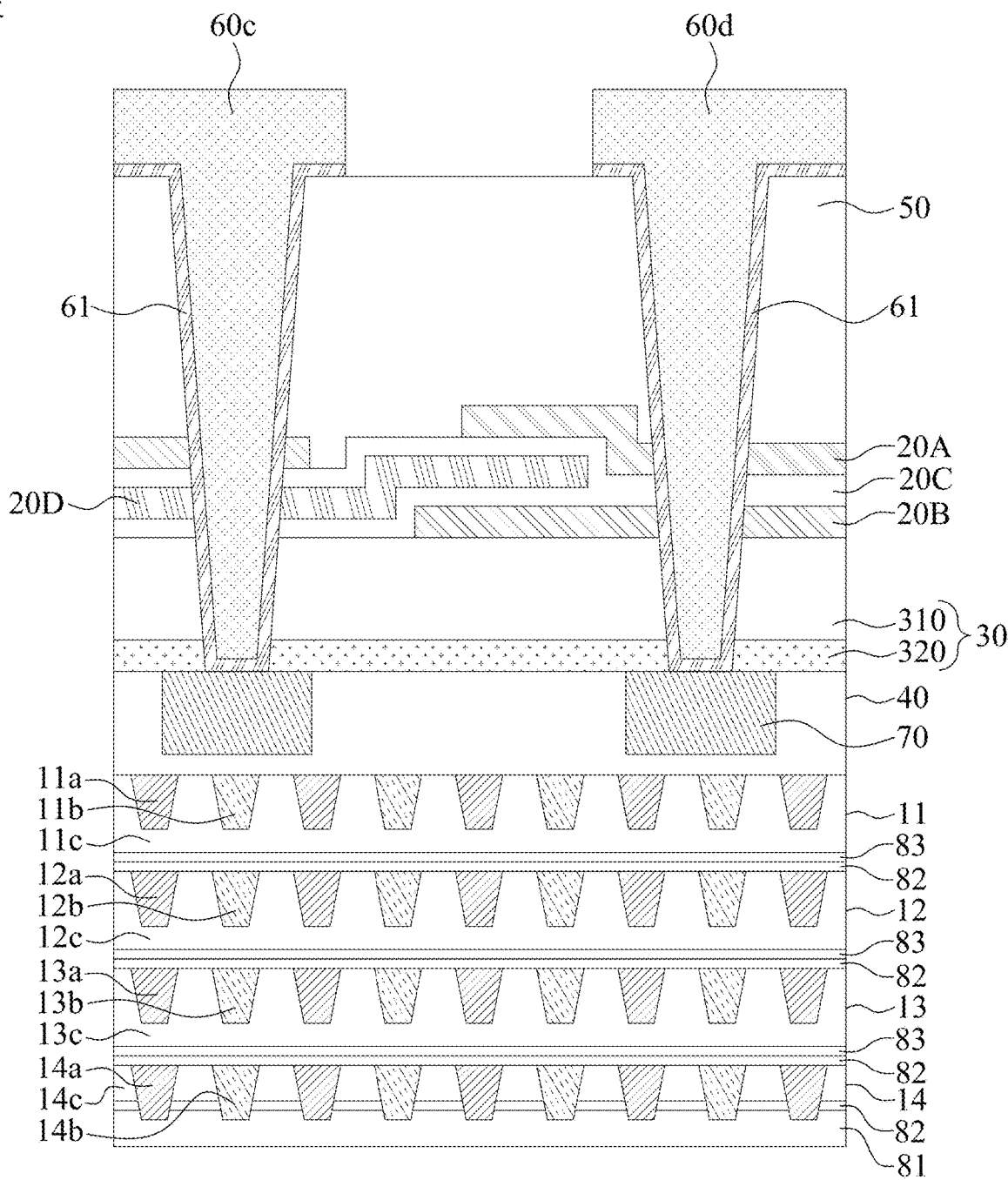

Referring to FIG. 8E, barrier layers 61 are conformably formed at least on the sidewalk of the via trenches 60c' and 60d', and a conductive material is formed inside the via trenches 60c' and 60d' to form conductive interconnections 60c and 60d. The conductive material can formed by a variety of techniques, e.g., deposition, electro plating, electro-less plating, sputtering, PVD, ALD, or the like. In some embodiments, the conductive material is AlCu. In some embodiments, a planarization operation is performed to remove the excessive conductive material above a top surface of the ILD 50.

FIGS. 9A to 9E are cross-sectional views of intermediate stages of a method of manufacturing a semiconductor structure in accordance with some embodiments of the present disclosure.

Figure 9A:
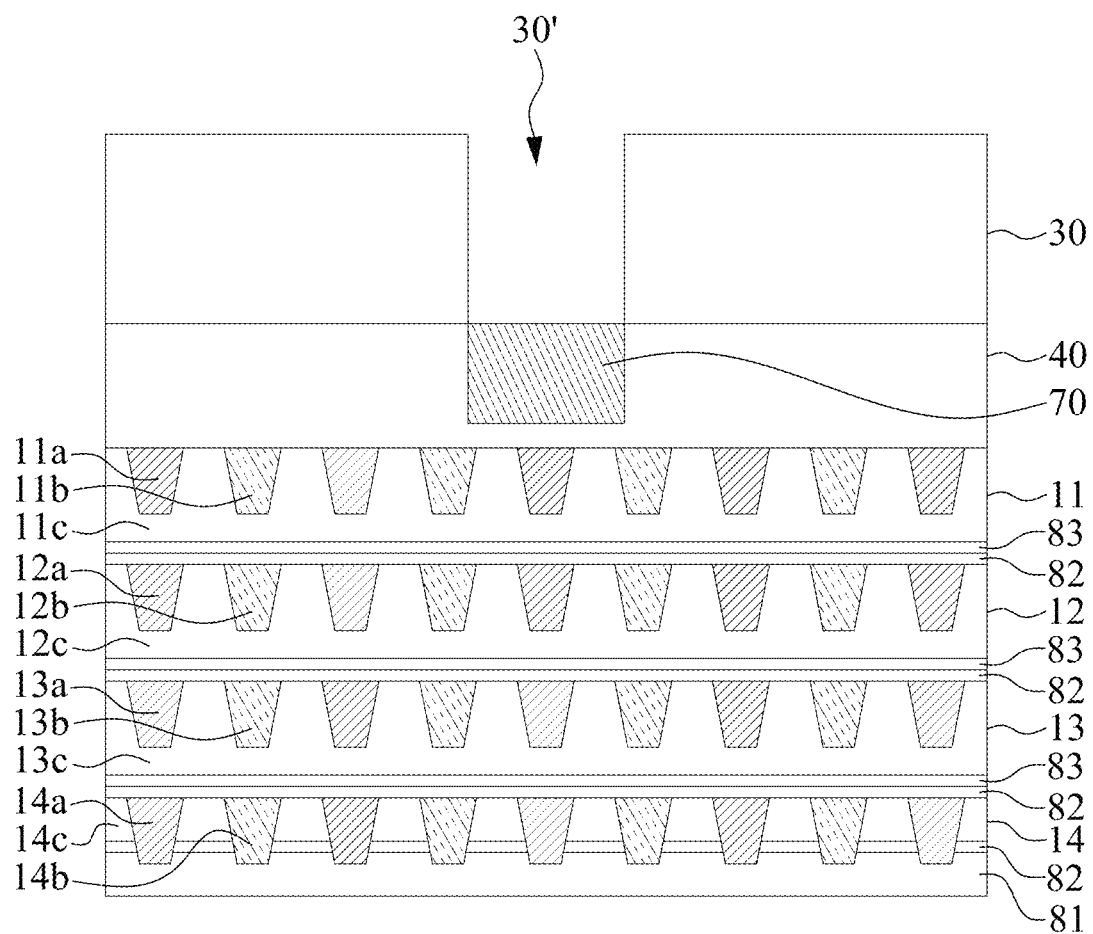
FIGS. 9A to 9E are cross-sectional views of intermediate stages of a method of manufacturing a semiconductor structure in accordance with some embodiments of the present disclosure.

Referring to FIG. 9A, operations similar to those illustrated in FIGS. 6A-6D are performed to form a stack of MOM capacitors 11-14, a dielectric layer 40, and a metal layer 70 including a plurality of metal lines within the dielectric layer 40. Next, a dielectric layer 30 is formed over the metal layer 70, and a trench 30' is formed from a top surface of the dielectric layer 30 into the dielectric layer 30. The trench 30' can be formed by using, for example, drilling, laser drilling, etching or other suitable operations.

Figure 9B:
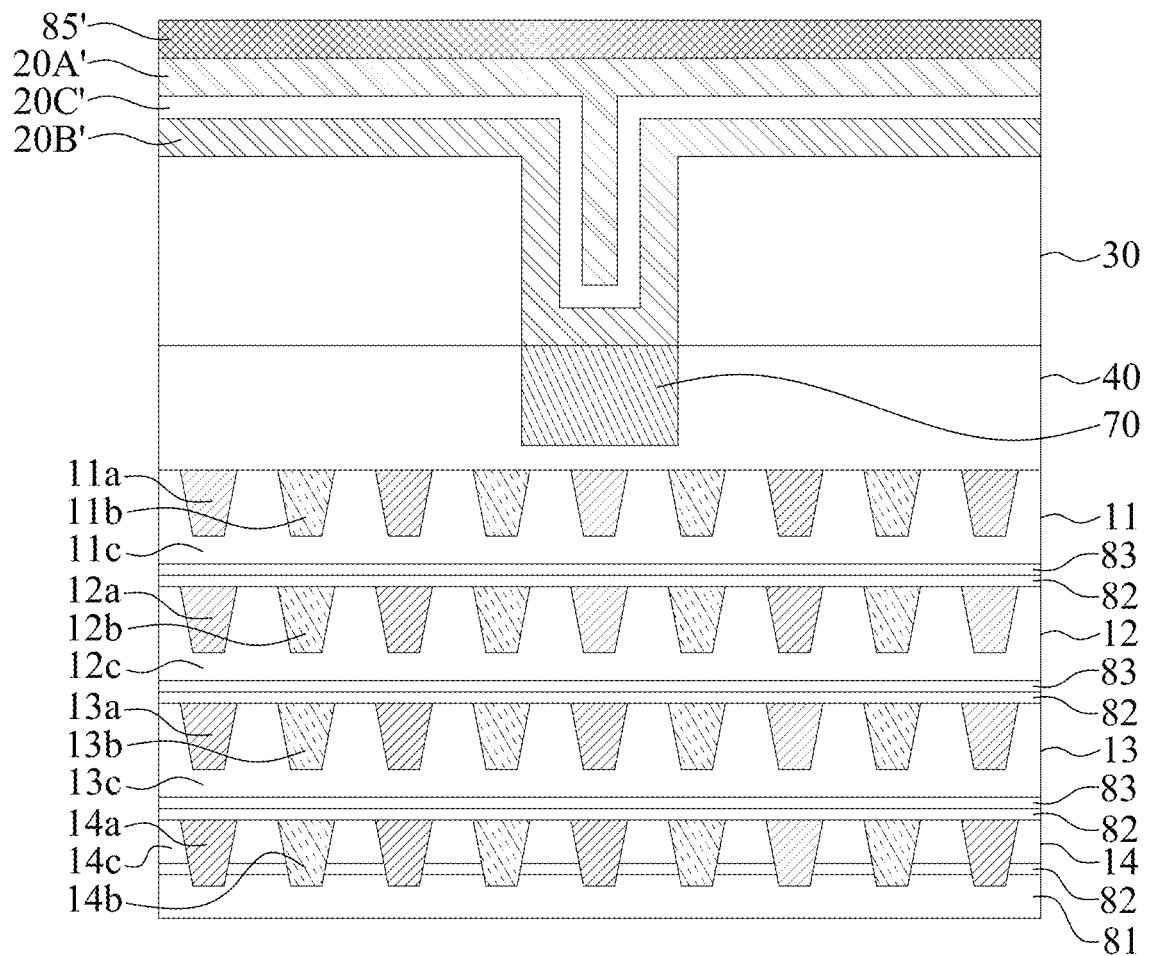

Referring to FIG. 9B, a conductive layer 20B' is formed on a bottom surface and sidewall surfaces of the trench 30' and on a top surface of the dielectric layer 30. In some embodiments, the conductive layer 20B' is conformally formed on the bottom surface and sidewall surfaces of the trench 30' and the top surface of the dielectric layer 30. Next, a dielectric layer 20C' is conformally formed on the conductive layer 20B'. In some embodiments, a portion of the dielectric layer 20C' is formed within the trench 30'. Next, a conductive layer 20A' is conformally formed on the dielectric layer 20C'. In some embodiments, a portion of the conductive layer 20A' is formed within the trench 30'. Next, a mask layer 85' is formed over the conductive layer 20A'.

Figure 9C:
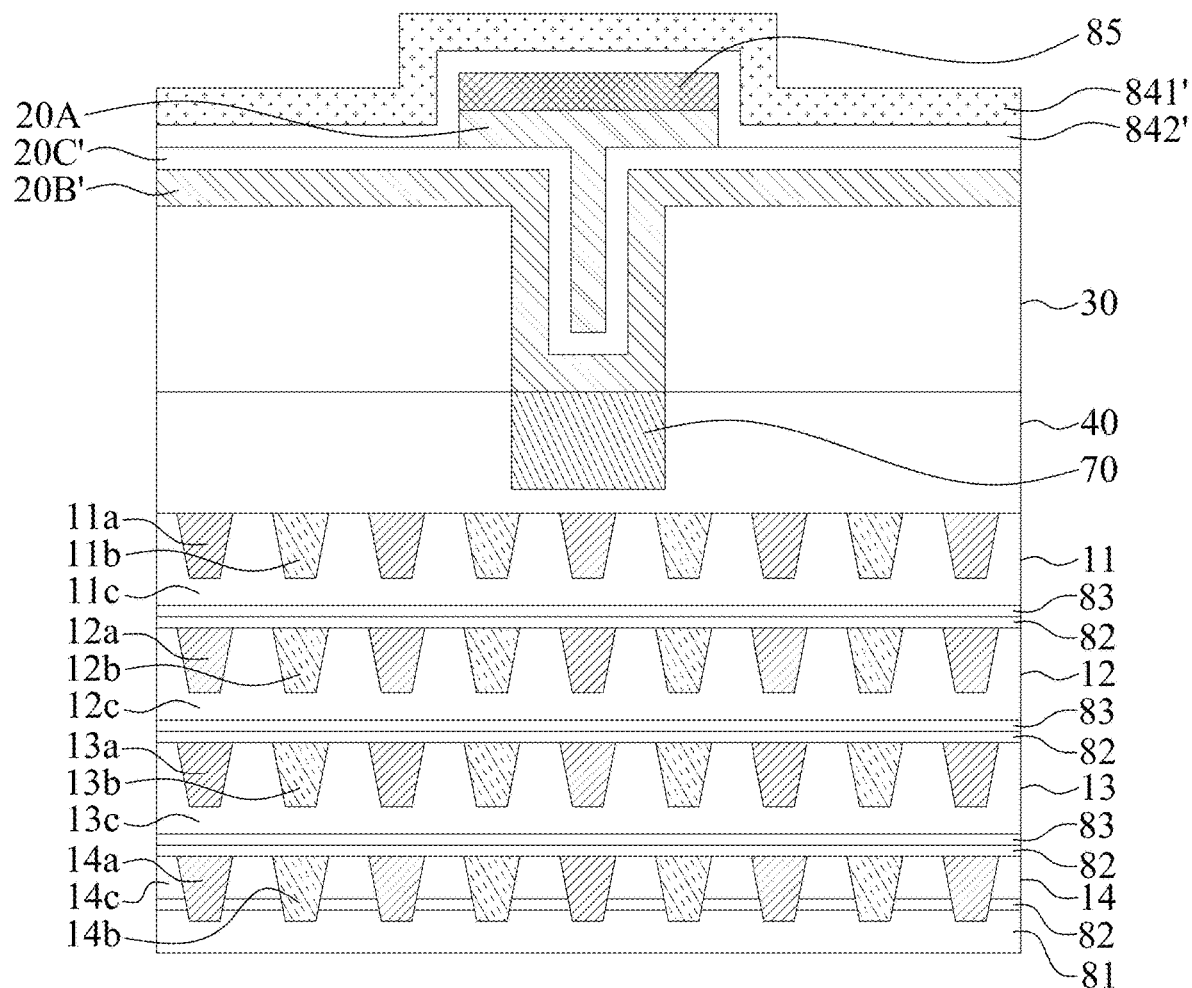

Referring to FIG. 9C, operations similar to those illustrated in FIGS. 6F-6G are performed to form a patterned mask layer 85, a conductive layer 20A, and a cap layer 84' over the mask layer 85 and the conductive layer 20A. In some embodiments, the cap layer 84' is formed by forming a sub-layer 842' over the mask layer 85, the conductive layer 20A, and the dielectric layer 20C, and forming a sub-layer 841' on the sub-layer 841'. The sub-layers 841' and 842' may be formed by one or more suitable deposition operations, for example, spin coating, deposition, or plasma enhanced deposition.

Figure 9D:
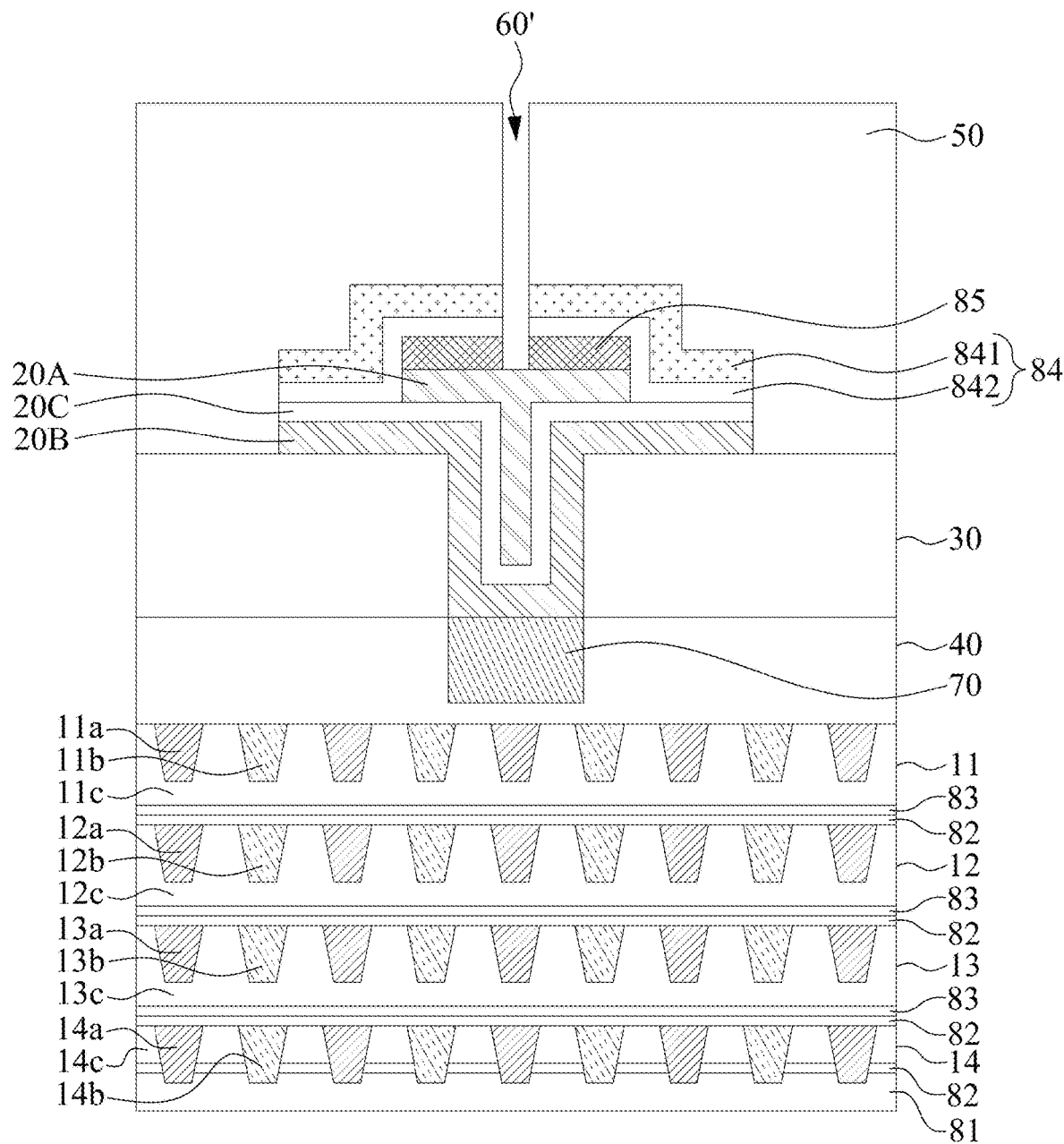

Referring to FIG. 9D, operations similar to those illustrated in FIG. 6H are performed to form the cap layer 84 including sub-layers 841 and 842, the dielectric layer 20C, and the conductive layer 20B, an ILD 50 is formed over the cap layer 84, the dielectric layer 20C, the conductive layer 20B, and the dielectric layer 30, and a via trench 60' is formed within the ILD 50 to expose a portion of the conductive layer 20A.

Figure 9E:
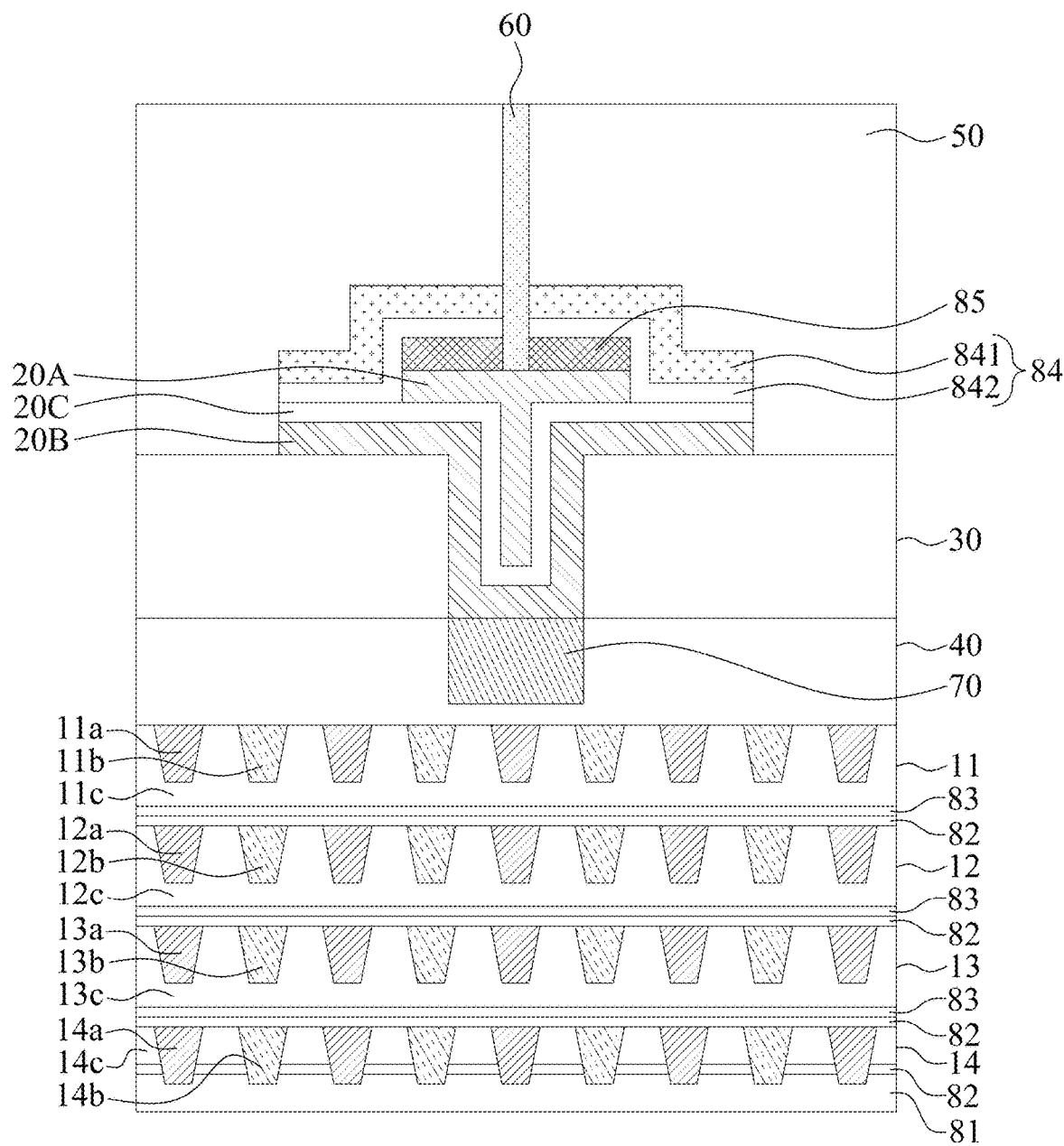

Referring to FIG. 9E, a conductive material is formed in the via trench 60' to form a conductive interconnection 60.

Figure 10A:
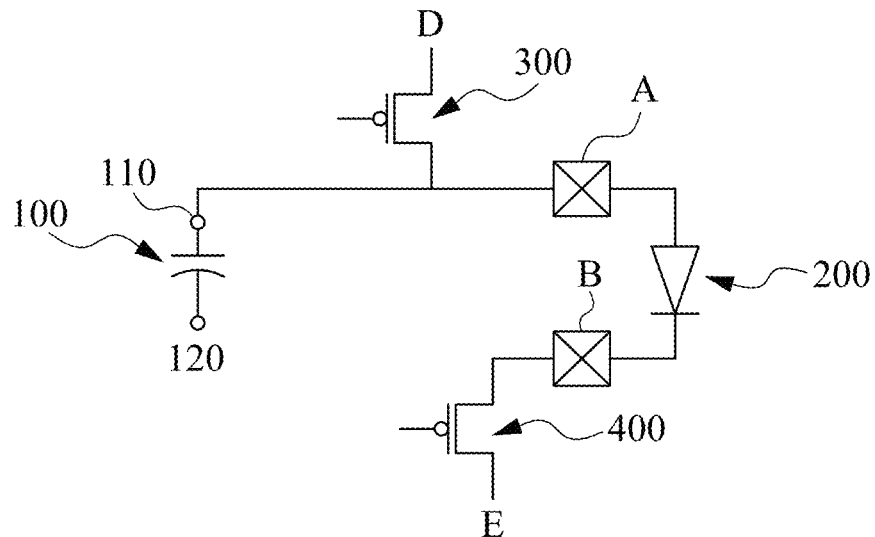
FIG. 10A illustrates a schematic view of a circuit in accordance with some embodiments of the present disclosure.

FIG. 10A illustrates a schematic view of a circuit 10A in accordance with some embodiments of the present disclosure. The circuit 10A includes a decoupling capacitor 100, transistors 300 and 400, and a diode 200. The decoupling capacitor 100 may be an in-die decoupling capacitor. The decoupling capacitor 100 may include one or more MOM capacitors and one or more MIM capacitors in accordance with some embodiments of the present disclosure, and the numbers of the MOM capacitors and the MIM capacitors may vary according to actual applications. For example, the decoupling capacitor 100 may include the structures of the MOM capacitor 11 and the MIM capacitor 20 as shown in FIG. 1, FIG. 1A, FIG. 1B, FIG. 1C, FIG. 1D, FIG. 2A, FIG. 2B, FIG. 3, FIG. 4, or FIG. 5.

The decoupling capacitor 100 has terminals 110 and 120, and the terminal 110 is electrically connected to the transistor 300 and the diode 200 (through the terminal A). The terminal 120 of the decoupling capacitor 100 is electrically connected to ground or a low voltage side. The terminal 120 of the decoupling capacitor 100 is configured to receive a voltage lower than a voltage at the terminal 110. In some embodiments, a voltage difference between the terminal 110 and the terminal 120 is equal to or greater than 6V. In some embodiments, referring to FIGS. 2A and 2B, the terminal 110 may be connected to the voltage V1. In some embodiments, referring to FIGS. 2A and 2B, the terminal 120 may be connected to the voltage V2 or the voltage V3. In some embodiments, referring to FIGS. 2A and 2B, the terminal 110 may be connected to the fingers 11a of the MOM capacitor 11, and the terminal 120 may be connected to the fingers 11b of the MOM capacitor 11 or the conductive layer 20A of the MIM capacitor 20.

The transistor 300 may be or include a high voltage (HV) pMOS transistor, e.g., a lateral diffused MOS (LDMOS) transistor, a bipolar-CMOS-DMOS (BCD) transistor, or a diode. In some embodiments, the HV pMOS transistor may include a planar MOS structure or a FinFet structure. In some embodiments, the transistor 300 may be or include an I/O component or a logic device. The source (e.g., the terminal D) of the transistor 300 may be configured to receive a supply voltage (e.g., VDD) or other circuits. The gate of the transistor 300 may be configured to receive a control signal to turn on or turn off the transistor 300. The drain of the transistor 300 may be connected to the decoupling capacitor 100 and the diode 200.

The diode 200 includes an anode (e.g., the terminal A) and a cathode (e.g., the terminal B). The terminal A of the diode 200 may function as an input of the diode 200. The terminal B of the diode 200 may function as an output of the diode 200. The terminal A of the diode 200 is electrically connected to the drain of the transistor 300 and the terminal 110 of the decoupling capacitor 100. The terminal B of the diode 200 is electrically connected to the transistor 400. The diode 200 may be or include a laser diode, a CMOS image sensor (CIS) pixel unit, an OLED pixel unit, or a combination thereof.

In some embodiments, the transistor 400 may be or include a HV nMOS transistor, e.g., a LDMOS transistor, a BCD transistor, or a diode. The transistor 400 has a drain connected to the terminal B of the diode 200. The transistor 400 has a gate configured to receive a control signal to turn on or turn off the transistor 400. The transistor 400 include a source (e.g., the terminal E) connected to a voltage source (e.g., ground or VSS) or other circuits.

Figure 10B:
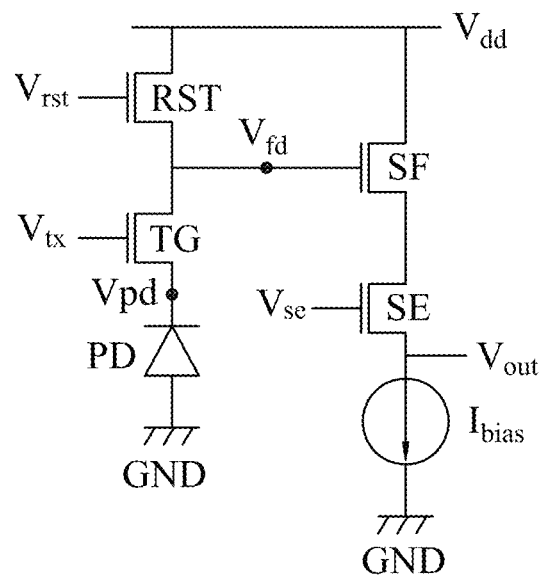
FIG. 10B illustrates a schematic view of a circuit in accordance with some embodiments of the present disclosure.

FIG. 10B illustrates a schematic view of a circuit 11B in accordance with some embodiments of the present disclosure. In some embodiments, the circuit 10B may be a CIS pixel unit. The CIS pixel unit may be a CIS four-transistor (4T) pixel. In some embodiments, the diode 200 illustrated in FIG. 10A may be replaced by the CIS 4T pixel shown in FIG. 10B. The CIS 4T pixel includes a transfer transistor TG coupled to a transfer voltage $V_{tx}$, a reset transistor RST coupled to a reset signal $V_{tx}$, a source follower SF monitoring a potential $V_{fd}$ of a floating diffusion (FD) which receives a signal charge $V_{pd}$ collected by a photodiode PD, and a select transistor SE connected to a current source $I_{bias}$ and an output voltage $V_{out}$. The voltage source $V_{dd}$ of the CIS 4T pixel shown in FIG. 11B may be connected to the terminal A illustrated in FIG. 10A, and the ground which is connected to the photodiode PD may be connected to the terminal B illustrated in FIG. 10A.

According to an embodiment, a semiconductor structure includes a first metal-dielectric-metal layer, a first dielectric layer, a first conductive layer, a second conductive layer, and a second dielectric layer. The first metal-dielectric-metal layer includes a plurality of first fingers, a plurality of second fingers, and a first dielectric material. The first fingers are electrically connected to a first voltage. The second fingers are electrically connected to a second voltage different from the first voltage, and the first fingers and the second fingers are arranged in parallel and staggeredly. The first dielectric material is between the first fingers and the second fingers. The first dielectric layer is over the first metal-dielectric-metal layer. The first conductive layer is over the first dielectric layer. The second conductive layer is over the first conductive layer. The second dielectric layer is between the first conductive layer and the second conductive layer.

According to an embodiment, an electronic device includes a decoupling capacitor. The decoupling capacitor has a first terminal electrically connected to a diode and a second terminal configured to receive a first voltage. The decoupling capacitor includes a first MOM capacitor, a MIM capacitor, and a dielectric layer. The first MOM capacitor includes a first finger and a second finger arranged in parallel. The MIM capacitor is over the first MOM capacitor. The MIM capacitor includes a conductive layer. The first terminal is connected to the first finger of the first MOM capacitor, and the second terminal is connected to the second finger of the first MOM capacitor or the conductive layer of the MIM capacitor. The dielectric layer is between the MIM capacitor and the first MOM capacitor.

According to an embodiment, a method of manufacturing a semiconductor structure includes: forming a patterned metal layer comprising a plurality of first fingers and a plurality of second fingers spaced apart from and in parallel to the first fingers; forming a dielectric material between the first fingers and the second fingers; forming a first dielectric layer over the first fingers, the second fingers, and the dielectric material; forming a first conductive layer over the first dielectric layer; forming a second dielectric layer over the first conductive layer; and forming a second conductive layer over the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first metal-dielectric-metal layer, comprising:
        a plurality of first fingers electrically connected to a first voltage;
        a plurality of second fingers electrically connected to a second voltage different from the first voltage, wherein the first fingers and the second fingers are arranged in parallel and staggeredly; and
        a first dielectric material between the first fingers and the second fingers;
    a first dielectric layer over the first metal-dielectric-metal layer;
    a first conductive layer over the first dielectric layer;
    a second conductive layer over the first conductive layer; and
    a second dielectric layer between the first conductive layer and the second conductive layer;
    wherein one of the first fingers is connected to a first terminal which electrically connects to an anode of a diode, and the diode includes at least one of a laser diode, a CMOS image sensor (CIS) pixel unit, an OLED pixel unit, or a combination thereof; and
    wherein the second conductive layer or one of the second fingers is connected to a second terminal which is configured to receive a second voltage lower than a voltage at the first terminal.

2. The semiconductor structure according to claim 1, wherein the first dielectric layer comprises:
    a first sub-layer on the first metal-dielectric-metal layer; and
    a second sub-layer between the first sub-layer and the first conductive layer.

3. The semiconductor structure according to claim 2, wherein the first sub-layer of the first dielectric layer comprises silicon carbide, silicon nitride, or a combination thereof, and the second sub-layer of the first dielectric layer comprises an oxide layer.

4. The semiconductor structure according to claim 1, further comprising a metal layer between the first metal-dielectric-metal layer and the first dielectric layer.

5. The semiconductor structure according to claim 1, wherein the first conductive layer overlaps with the first metal-dielectric-metal layer from a top view perspective.

6. The semiconductor structure according to claim 1, wherein a projection of the second conductive layer is within the first metal-dielectric-metal layer.

7. The semiconductor structure according to claim 1, further comprising a second metal-dielectric-metal layer stacked with the first metal-dielectric-metal layer, the second metal-dielectric-metal layer comprising:
    a plurality of third fingers electrically connected to the first voltage;
    a plurality of fourth fingers electrically connected to the second voltage, wherein the third fingers and the fourth fingers are arranged in parallel and staggeredly; and
    a second dielectric material between the third fingers and the fourth fingers.

8. The semiconductor structure according to claim 7, wherein the first fingers and the third fingers are in parallel.

9. The semiconductor structure according to claim 1, wherein the first conductive layer is connected to the first voltage, and the second conductive layer is connected to the second voltage.

10. The semiconductor structure according to claim 1, wherein the first conductive layer is electrically connected to the second fingers of the first metal-dielectric-metal layer, and the second conductive layer is connected to a third voltage different from the first voltage.

11. An electronic device, comprising:
    a decoupling capacitor having a first terminal electrically connected to a diode and a second terminal configured to receive a first voltage, the decoupling capacitor comprising:
        a first MOM capacitor comprising a first finger and a second finger arranged in parallel;
        a MIM capacitor over the first MOM capacitor and comprising a conductive layer, wherein the first terminal is connected to the first finger of the first MOM capacitor, and the second terminal is connected to the second finger of the first MOM capacitor or the conductive layer of the MIM capacitor; and
        a dielectric layer between the MIM capacitor and the first MOM capacitor;
    wherein:
    the diode includes at least one of a laser diode, a CMOS image sensor (CIS) pixel unit, an OLED pixel unit, or a combination thereof;
    the first terminal of the decoupling capacitor is electrically connected to an anode of the diode; and
    the first voltage is lower than a voltage at the first terminal.

12. The electronic device according to claim 11, wherein the decoupling capacitor further comprises a second MOM capacitor and an etch stop layer between the first MOM capacitor and the second MOM capacitor.

13. The electronic device according to claim 11, wherein the dielectric layer comprises:
   a first sub-layer proximal to the first MOM capacitor, the first sub-layer comprising silicon carbide, silicon nitride, or a combination thereof; and
   a second sub-layer proximal to the MIM capacitor.

14. The electronic device according to claim 11, wherein the first MOM capacitor and the MIM capacitor overlap from a top view perspective.

15. The electronic device according to claim 11, wherein the decoupling capacitor further comprises a second MOM capacitor, wherein the first MOM capacitor is interposed between the dielectric layer and the second MOM capacitor, and the first MOM capacitor and the second MOM capacitor comprise a plurality of conductive fingers in parallel and a dielectric material between the conductive fingers.

16. The electronic device according to claim 11, wherein the MIM capacitor and the first MOM capacitor are electrically connected in parallel or in series.

17. The electronic device to claim 11, further comprising a first transistor having a drain electrically connected to the first terminal of the decoupling capacitor, wherein the first transistor includes a high voltage pMOS transistor.

18. The electronic device according to claim 17, further comprising a second transistor having a drain electrically connected to a cathode of the diode, wherein the second transistor includes a high voltage nMOS transistor.

19. A method of manufacturing a semiconductor structure, comprising:
   forming a patterned metal layer comprising a plurality of first fingers and a plurality of second fingers spaced apart from and in parallel to the first fingers;
   forming a dielectric material between the first fingers and the second fingers;
   forming a first dielectric layer over the first fingers, the second fingers, and the dielectric material;
   forming a first conductive layer over the first dielectric layer;
   forming a second dielectric layer over the first conductive layer;
   forming a second conductive layer over the second dielectric layer;
   connecting one of the first fingers to a first terminal which electrically connects to an anode of a diode, wherein the diode includes at least one of a laser diode, a CMOS image sensor (CIS) pixel unit, an OLED pixel unit, or a combination thereof; and
   connecting the second conductive layer or one of the second fingers to a second terminal which is configured to receive a first voltage lower than a voltage at the first terminal.

20. The method according to claim 19, wherein forming the first dielectric layer comprises:
   forming a first sub-layer on the first fingers, the second fingers, and the dielectric material; and
   forming a second sub-layer on the first sub-layer.

\* \* \* \* \*